(12) United States Patent
Gonsalves et al.

(10) Patent No.: US 7,049,044 B2
(45) Date of Patent: May 23, 2006

(54) NANOCOMPOSITE NEGATIVE RESISTS FOR NEXT GENERATION LITHOGRAPHIES

(75) Inventors: Kenneth Gonsalves, Concord, NC (US); Mohammed Azam Ali, Charlotte, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 203 days.

(21) Appl. No.: 10/324,642

(22) Filed: Dec. 19, 2002

(65) Prior Publication Data

US 2006/0088787 A1    Apr. 27, 2006

(51) Int. Cl.
 G03C 1/73    (2006.01)
 G03F 7/038    (2006.01)
 G03F 7/039    (2006.01)
 G03F 7/20    (2006.01)

(52) U.S. Cl. .............. 430/270.1; 430/280.1; 430/905; 430/910; 430/914; 430/921; 430/925; 430/942; 430/966; 430/302; 430/325; 430/326; 526/287; 526/279

(58) Field of Classification Search ............. 430/270.1, 430/280.1, 302, 325, 326, 905, 910, 914, 430/921, 925, 966, 942
See application file for complete search history.

(56) References Cited

U.S. PATENT DOCUMENTS

| | | | |
|---|---|---|---|
| 4,717,513 A | 1/1988 | Lewis et al. | |
| 5,780,201 A | 7/1998 | Sabnis et al. | |
| 6,232,034 B1 | 5/2001 | Kasai et al. | |
| 6,238,541 B1 * | 5/2001 | Sasaki et al. | 205/211 |
| 6,306,556 B1 | 10/2001 | Matsuo et al. | |
| 6,420,084 B1 | 7/2002 | Angelopoulos et al. | |
| 6,884,562 B1 * | 4/2005 | Schadt, III et al. | 430/270.1 |
| 2002/0182541 A1 * | 12/2002 | Gonsalves | 430/287.1 |

FOREIGN PATENT DOCUMENTS

| | | | |
|---|---|---|---|
| EP | 0 473 547 A1 | * | 8/1991 |
| JP | 6-228086 | * | 8/1994 |

OTHER PUBLICATIONS

Chem. Abstract (AN 1992:408654)—English abstract for EP 473547 (Steinmann et al).*
Chem. Abstract (AN 1995:198693)—English abstract for JP 06-228086 (Muraoka et al).*
JPO Abstract—English abstract for JP 06-228086 (Muraoka et al).*
Full, formal English translation of JP 6-228086 of JP 6-228086 (Muraoka et al), provided by PTO.*
Chem. Abstract 119:96450—English abstract for JP 5-086133 (Akashi et al).*
Brainard, Robert L., et al., "Resists for next generation lithography," Microelectronic Engineering (2002), article in press.

(Continued)

Primary Examiner—Sin Lee
(74) Attorney, Agent, or Firm—Kilpatrick Stockton LLP; J. Clinton Wimbish

(57) ABSTRACT

The present invention provides new high resolution nanocomposite resists applicable to next generation lithographies, methods of making these novel resists, and methods of using these new resists in lithographic processes to effect state-of-the-art lithographies. New nanocomposite negative resists comprising a photoacid generating component, a styrene component, and an optional polyhedral oligosilsequioxane component are provided. Negative resists of this invention may also contain an optional methacrylate component. This invention and the embodiments described herein constitute fundamentally new architectures for high resolution resists.

32 Claims, 3 Drawing Sheets

PHS          PAG          POSS (R = cyclopentyl)

OTHER PUBLICATIONS

Canning, John, "Next generation Lithography: When, why, and at what cost?" Microelectronic Engineering (2002), article in press, abstract only.

Gonsalves, Kenneth E., et al., "Combinatorial approach for the synthesis of terpolymers and their novel application as very-high-contrast resists for x-ray nanolithography," J. Vac. Sci. Technol. B 18(1), Jan./Feb. 2000, pp. 325-327.

Hu, Younqi, et al., "Nanocomposite resists for electron beam nanolithography," Microelectronic Engineering 56 (2001), pp. 289-294.

Merhari, L., et al., "Nanocomposite resist systems for next generation lithography," Microelectronic Engineering (2002), article in press.

Saito, Satoshi, et al., "A new positive electron-beam resist material composed of catechol derivatives," Microelectronic Engineering (2002), article in press.

Wu, Hengpeng, et al., "Preparation of a Photoacid Generating Monomer and Its Application in Lithography," Advanced Functional Materials, 11(4), Aug. 2001, pp. 271-276.

Wu, Hengpeng, et al., "A Novel Single-Component Negative Resist for DUV and Electron Beam Lithography," Advanced Materials, 13(3), Feb. 2001, pp. 195-197.

Wu, Henpeng, et al., "Incorporation of polyhedral oligosilsesquioxane in chemically amplified resists to improve their reactive ion etching resistance," J. Vac. Sci. Technol. B 19(3), May/Jun. 2001, pp. 851-855.

Wu, Henpeng, "Synthesis and Characterization of Radiation-sensitive Polymers and Their Application in Lithography," Ph.D. dissertation, University of Connecticut, Apr. 2001.

* cited by examiner

POSS (R = cyclopentyl)   PAG   PHS

PHS   PAG   POSS (R = cyclopentyl)

NANOCOMPOSITE NEGATIVE RESISTS FOR NEXT GENERATION LITHOGRAPHIES

STATEMENT OF GOVERNMENT LICENSE RIGHTS

This invention was made through the support of the National Science Foundation (Grant No. DMR 9902944), and the Department of Defense (Defense Advanced Research Projects Agency Grant No. N66001-00-1-8903). The Federal Government may retain certain license rights in this invention.

TECHNICAL FIELD OF THE INVENTION

The present invention provides new high resolution negative resists applicable to next generation lithographies, methods of making these novel resists, and new lithographic processes using these resists to effect state-of-the-art lithographies. New nanocomposite resist architectures, particularly new chemically amplified resists that incorporate inorganic moieties and photoacid generating groups are described herein, as representative of new class of organic-inorganic hybrid resists.

BACKGROUND OF THE INVENTION

Within the next decade the microelectronic industry will require a lithographic process capable of mass-producing integrated circuits with sub-70 nanometer (nm) critical dimensions (see: L. R. Harriott, *Materials Today* 2, 9 (1999)). This formidable challenge is unlikely to be achieved by evolutionary steps. Moreover, it is uncertain whether photolithography, which constitutes the current paradigm for the microelectronics industry, can withstand these extreme demands in terms of dimension tolerances (10 nm or less) and positioning accuracy (1 nm or less). Extreme UV (EUVL), X-ray (XRL), electron beam (EBL) and ion beam (IBL) lithographies have therefore emerged as more promising candidates for next generation nanofabrication than standard photolithographies, because the shorter the radiation wavelength employed in the lithographic process, the finer the theoretical resolution. R. L. Brainard, G. G. Barclay, E. H. Anderson and L. E. Ocola, *Microelec. Engineering* 1, 2002.

In order to fully exploit these next generation, sub-100 nm lithographic exposure tools, it is essential to develop compatible, next generation resists—that is, imaging or recording media—that are capable of accommodating the higher resolutions these new exposure tools provide. Such a resist material would need to achieve high contrast, high resolution and high plasma etch resistance for pattern transfer to a substrate. Further, this combination of high contrast and high resolution necessary for sub-100 nm processes must be combined with high resist sensitivity for high throughput applications.

One example of the disparity between state-of-the-art exposure tools and presently available recording media is seen in electron beam lithography. Although instrumentation for electron beam exposure is capable of sub-100 nm resolution, current resists for recording these exposure patterns suffer from electron proximity effects, which result in resist degradation well beyond the area of actual exposure. Accordingly, this invention provides not only new resists for electron beam lithography, but also new resists adaptable to many short wavelength lithographic methods for higher-resolution, next generation nanofabrication.

SUMMARY OF THE INVENTION

The present invention addresses many of the current limitations in next generation lithographic techniques by providing new resists that achieve high sensitivity, high contrast, high resolution and high plasma etch resistance for pattern transfer to a substrate. These goals are achieved through a variety of new resist architectures that incorporate new functional components into resist polymer matrices in novel ways.

Of all the lithographic technologies for sub-100 nm patterning, electron beam lithography (EBL) is considered the paradigm for next generation lithography, as it is perhaps the most versatile technique benefiting from research and development knowledge accumulated over the past several decades. However, unlike ion beam lithography, EBL suffers from a serious intrinsic problem, namely electron proximity effects which stem from polymer/electron interactions at the molecular level. These effects arise from secondary electrons that induce severe degradation of the pattern definition, as the uniform exposure of the resist by the incident electron beam gives rise to a non-uniform distribution of actual exposure in the pattern writing area. During the past two decades, attempts have been made to decrease the electron proximity effects (see, for example: A. N. Broers, *IBM J. Res. Develop.* 32, 502 (1988)) but no significant breakthrough has been achieved.

A similar intrinsic problem arises using extreme ultraviolet lithography (EUVL at 13.4 nm, or "13 nm" Lithography)), viz. the generation of photoelectrons in the polymeric resist. These photoelectrons, like the secondary electrons in electron beam resists, induce resolution degradation from line broadening due to the off-axis pathways of photoelectrons. Significant line edge roughness and critical dimensions no better than about 65 nm are presently obtained with the most advanced EUV resists. The high-aspect ratio and dense patterns in commercial resists tend to collapse for sub-100 nm resolution. Moreover, outgassing can accompany line edge roughness and plague other EUV resists. Further, the transparency of commercial resists to the 13 nm radiation is far from ideal. What is needed is an alternative approach to resist materials that can drastically reduce the electron proximity effects and line broadening without requiring the modification of current EBL or EUVL exposure machines.

Projection optical or vacuum ultraviolet lithography at 157 nm (VUV or "157 nm" lithography) also requires a fundamental examination of resist compatibility with the excimer laser radiation utilized by this method. Currently available resists are characterized by a serious lack of transparency to the 157 nm radiation. Some prototype resin formulations, while offering good transparency, lack the necessary etch resistance to achieve the desired dimension tolerances and positioning accuracy. What is needed is a way to improve the etch resistance, high temperature stability, pattern collapse and line-edge roughness in resists that are compatible with this method, while maintaining the optical transparency that is required at this wavelength.

Two primary types of resist polymers that have been investigated in recent years are the chain-scission resists designed for EBL, and the chemically amplified (CA) resists designed for both EBL and photolithographies. Upon irradiation of a chain-scission resist film with an electron beam, the molecular weights of the polymers in the exposed regions are decreased via chain scission reactions arising from the irradiation. As a result, solubility differentiation is achieved between the exposed and the unexposed regions.

The CA resists achieve solubility differentiation based on an acid-catalyzed deprotection reaction which changes the polarity of the polymer in the exposed region. A typical CA resist formula consists of a matrix polymer and a photoacid generator (PAG). Upon irradiation with an electron beam or extreme UV radiation, the PAG generates a strong acid that catalyzes the deprotection reaction.

Several classes of PAGs have been used in CA resists, including ionic PAGs such as sulfonium and ionium salts, as well as nonionic PAGs. However these PAGs are almost exclusively used in their monomeric forms, and small molecule PAGs typically exhibit limited compatibility with the resist polymer matrix. As a result, problems such as phase separation, non-uniform acid distribution, and non-uniform acid migration occurring during temperature fluctuations (e.g. variation in baking processing) may arise. Such limitations frequently lead to an undesirable, premature and non-uniform deprotection reaction in the CA resist film. It would be desirable to develop a fundamentally new way of adding PAGs into a resist polymer to alleviate these problems.

Typically, both the chain-scission resists and the chemically amplified (CA) resists are polymeric organic materials. While it is generally believed that CA resist concept offers the best strategy for advancements in resist technology in optical lithography, EBL and XRL, pure organic resists have generally posed certain deficiencies. For example, etch resistance, high temperature stability, pattern collapse, line-edge roughness, and other problems can limit the applicability of organic resists. Some resist technologies have relied upon inorganic materials to address these limitations. For example, inorganic resists such as silica and metal halides are generally not subject to the secondary electron degradation effects. However, patterning at high doses and the difficulty in inorganic resist coating have hampered their applications. Additionally, while it has been demonstrated that inorganic resists are capable of exhibiting a higher contrast than standard organic resists, their intrinsic lower sensitivity and complex deposition methods make them more suitable for ion beam lithography than for electron beam lithography. It would be advantageous to develop new resists that combined, to the extent possible, the most desirable properties of organic resists with those of the inorganic resists.

One of the more successful CA resists developed in recent years has been a chemically amplified (CA) resist using tert-butyl methacrylate (TBMA) as deblocking component. (See, for example: G. M. Wallraff and W. D. Hinsberg, Chem. Rev. 99, 1801 (1999).) This methacrylate-based resist, designed for photolithography, has high resolution and sensitivity, however it lacks the plasma etch resistance required for subsequent pattern transfer to the substrate. What is needed is a way to incorporate the advantages of those inorganic systems into methacrylate-based CA resist systems, in order to improve the plasma etch resistance of the resist for enhancing its utility.

Although the CA resist concept may offer the best strategy for future advancements in resist technology in certain types of lithography, the very nature of an acid-catalyzed deprotection pathway gives rise to inherent problems such as acid diffusion and post-exposure instability. To address these problems, it would be desirable to design and develop resists that are directly sensitive to radiation without utilizing the concept of chemical amplification. Such a resist would desirably achieve the high sensitivity necessary to meet the requirements for high throughput.

Therefore, it has become imperative to address these current limitations in lithography by providing new resists that afford the high sensitivity, high contrast, high resolution and high plasma etch resistance. These resists would also seek to take full advantage of the next generations lithographic irradiation sources, including EBL, VUV, and EUVL, by reducing the electron proximity effects without requiring the modification of current EBL, VUV, or EUVL exposure instruments. Some of the desired resists would, to the extent possible, combine the advantages and most desirable properties of organic resists with those of inorganic resists. In addition, next generation methacrylate-based CA resist systems would seek fundamentally new architectures that afforded enhanced plasma etch resistance and improved pattern transfer to the substrate. New CA resists need to be engineered to provide novel ways to incorporate and extend the compatibility of small molecule PAGs with the resist polymer matrix. Moreover, next generation resists that are directly sensitive to radiation without utilizing the concept of chemical amplification would be sought.

Accordingly, the present invention provides these novel alternative approaches to high resolution resists applicable to next generation lithographies. In one embodiment, this invention provides new ways to impart greater plasma stability to CA resists, including fundamentally new ways to synergistically combine organic and inorganic resist designs. In one embodiment, methacrylate-based CA resists that incorporate inorganic clusters of polyhedral oligosilsesquioxane (POSS) into the side chains are provided. By making the inorganic cluster a component of the polymer, properties such as RIE resistance, pattern stability, and temperature stability of the resists are improved.

The present invention also affords fundamentally new ways to enhance the compatibility of PAGs with the resist polymer matrix. In one embodiment, new resist samples are prepared by co-polymerization of a PAG component with various methacrylate compounds, even at high PAG loading levels. This new resist architecture makes the PAG moiety an actual modular unit within the resist polymer, thereby directly addressing the limited compatibility of monomeric PAGs with the resist polymer matrix. By doing so, problems of phase separation and non-uniform acid distribution frequently observed for CA resists containing a high percentage of monomeric PAGs are substantially eliminated.

The present invention also affords fundamentally new ways to enhance the compatibility of PAGs with the resist polymer matrix, while supporting the small dimension tolerances, high aspect ratio, and positioning accuracy required for next generation resists. In one embodiment, new resist samples are prepared by co-polymerization of a monomeric PAG component with an epoxy-containing POSS™ monomer to from a first polymer, and then crosslinking the first polymer with a second, low molecular weight poly(para-hydroxystyrene) (poly-PHS) polymer to form the tailored resist material. In an alternative embodiment, this resist design is based on two polymeric components wherein one polymer or oligomer is generated by reaction of the p-hydroxystyrene (PHS) monomer and a PAG monomer to form a poly- or oligo-(hydroxystyrene-PAG) first polymer (or oligomer). This first polymer is then cross-linked with an epoxy-containing POSS monomers that contain pendent epoxy groups.

This new resist architecture makes the PAG moiety an actual modular unit within the resist polymer, thereby directly addressing the limited compatibility of monomeric PAGs with the resist polymer matrix. By doing so, problems of phase separation and non-uniform acid distribution frequently observed for CA resists containing a high percentage of monomeric PAGs are substantially eliminated.

The present invention addresses one of the fundamental problems of projection optical lithography at 157 nm, namely improving the etch resistance and pattern stability in a suitable resist, while maintaining the optical transparency required at this wavelength. This goal is accomplished by incorporating inorganic clusters of polyhedral oligosilsesquioxanes (POSS™) into the resist polymers, using components with substituents and side chains that are transparent at this wavelength.

Accordingly, one aspect of the present invention is to provide new resists with increased resolution and improved pattern definition over currently available resist materials such as poly(α-chloroacrylate-co-α-methyl styrene) (ZEP520®).

Another aspect of this invention is to reduce the proximity effects and thereby provide better resolution in electron beam lithography, vacuum ultraviolet, extreme ultraviolet lithography, and the like, over that currently available using resist materials.

One additional aspect of the present invention is to provide a nanocomposite resist comprising a nanoparticle component, especially an inorganic nanoparticle component An additional aspect of this invention is the development of improved negative resists with higher softening transition temperatures ($T_g$) and increased rigidity due to the increased density of the resist films, that exhibit enhanced resist performance for nanometer pattern fabrication.

Yet another aspect of this invention is designing and preparing new resist films with improved mechanical properties that will prevent the collapse of dense high-aspect-ratio nanometer patterns, and display increased etch resistance.

A further aspect of the present invention is to design new resists with improved reactive ion etch (RIE) resistance, without sacrificing resist sensitivity.

Yet another aspect of this invention is the development of novel CA resists that incorporate photoacid generating groups (PAGs) at high loading/high concentration, but do not suffer from the phase separation, non-uniform acid distribution, and non-uniform acid migration problems common among standard CA resists.

An additional aspect of this invention is to provide polymeric chemically amplified negative resists of the proper composition and characteristics that avoid or minimize the effects of outgassing and line edge roughness.

Another aspect of this invention is to combine organic and inorganic resist designs by incorporating inorganic clusters, especially polyhedral oligosilsesquioxane (POSS™) moieties, into the side chains of a CA resist. Therefore, the present invention addresses the lack of reactive ion etch (RIE) resistance in many CA resists, that is necessary for pattern transfer.

Further aspects of this invention include providing new lithographic processes utilizing the novel resists of the present invention, as well as providing integrated circuits prepared by these new lithographic process.

These and other features, aspects, objects and advantages of the present invention will become apparent after a review of the following detailed description of the disclosed embodiments.

DETAILED DESCRIPTION OF THE INVENTION

Figure 1:
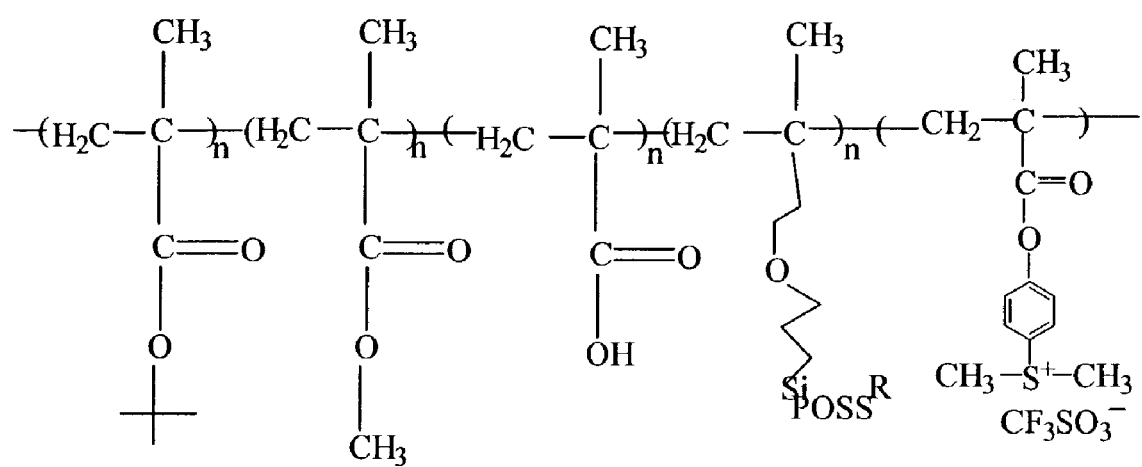
FIG. 1 illustrates the microstructure of a MMA/TBMA/MAA/POSS copolymer of the present invention. In this embodiment, the pendant group that contains the $Si_{POSS}^R$ moiety represents any POSS-type species with a polymerizable group and R substituents as required by the context and as disclosed herein. For example the $Si_{POSS}^R$ moiety shown in FIG. 1, along with its link to the polymer backbone, typically represents methacrylcyclopentyl-POSS, as defined herein.

The present invention provides new high resolution resists applicable to next generation lithographies, methods of making these novel resists, and methods of using these resists to effect state-of-the-art lithographies.

Definitions

In order to more clearly define the terms used herein, the following definitions are provided.

A resist, as used herein, refers to the imaging or recording medium, usually a polymeric material, that is used in a lithographic process, typically for the production of integrated circuits. In a general sense, a resist is a material that is used to prevent a particular chemical or physical reaction such as chemical attack, electrodeposition, vapor phase deposition, or other reactions.

Lithography, or a lithographic process, as used herein, refers to a process by which the pattern, typically a pattern of an integrated circuit, is imprinted onto a substrate or a resist. Lithography may be accomplished by exposing a recording medium with radiation of some form, followed by developing the pattern to be used, which results in the removal of either the exposed or the unexposed material. A variety of radiation sources may be used, including but not limited to, ultraviolet (UV) radiation, vacuum ultraviolet (VUV), extreme ultraviolet (EUV), deep ultraviolet (DUV) radiation, X-rays, electron beams (EB), and ion beams (IB).

A nanocomposite, as used herein, refers to a combination of two or more phases containing different compositions or structures, wherein at least one of these phases is in the nanoscale regime (1–100 nm).

A metal oxide nanoparticle, as used herein, refers to nanometer-sized particles containing oxygen and at least one metal. As used herein, this definition refers primarily discrete nanoscale molecular clusters that containing oxygen and at least one metal, such as polyhedral oligosilsesquioxanes (POSS™). Examples of POSS™ clusters include, but are not limited to, the series of cubic clusters of the general formula $Si_8O_{12}(OR)_8$ or $Si_8O_{12}R_8$ where R=alkyl, substituted alkyl, cycloalkyl, substituted cycloalkyl, silyl, substituted silyl, aryl, substituted aryl, aralkyl, substituted aralkyl, alkenyl, substituted alkenyl. Other examples of POSS™ clusters are the polyhedral clusters of the type $Si_{12}O_{18}(OR)$ $_{12}$, or $Si_{12}O_{18}R_{12}$. where R=alkyl, substituted alkyl, cycloalkyl, substituted cycloalkyl, silyl, substituted silyl, aryl, substituted aryl, aralkyl, substituted aralkyl, alkenyl, substituted alkenyl. Typically, these POSS cluster nanoparticles contain at least one pendent polymerizable or cross-linkable R group that permits the POSS to be incorporated into a polymer backbone or used to cross-link a polymer. Whether referring to a metal oxide particle, or a discrete molecular cluster, all of these materials may be described as "metal oxide" nanoparticles. Specifically, "silica nanoparticles" are used herein to describe the nanoscale clusters of the general formula $Si_8O_{12}(OR)_8$, $Si_8O_{12}R_8$, $Si_{12}O_{18}(OR)_{12}$, or $Si_{12}O_{18}R_{12}$.

A nanoparticle, as used herein, refers to nanometer-sized particles, usually 1–100 nm in diameter, regardless of composition or structure of the particle. Thus, nanoparticle is a generic term that refers to nanometer-sized particles containing at least one metal or at least one non-metal element as a component, and therefore this term includes the "metal oxide nanoparticle" described above. Accordingly, this definition includes, but is not limited to, particles of borides, carbides, silicides, nitrides, phosphides, arsenides, oxides, sulfides, selenides, tellurides, halides (fluorides, chlorides, bromides, or iodides), and combinations thereof. As the context requires, the term nanoparticle usually includes any necessary pendent groups, such as any olefin (-ene) or epoxy groups, that are required for incorporation into the resist polymer.

1. Incorporation of Polyhedral Oligosilsesquioxanes (POSS) into Chemically Amplified (CA) Resists The present invention addresses one of the fundamental drawbacks of methacrylate-based CA resists, namely their lack of reactive ion etch (RIE) resistance necessary for pattern transfer, by providing a fundamentally new way to synergistically combine organic and inorganic resist designs. In one embodiment, this invention provides methacrylate-based CA resists that incorporate inorganic clusters of polyhedral oligosilsesquioxanes (POSS™) into the polymer side chains. Thus, the present invention encompasses a polymeric chemically amplified resist comprising a methacrylate component and a polyhedral oligosilsequioxane component, wherein the POSS component contains a polymerizable group that permits its incorporation into the methacrylate polymer chain. The methacrylate component is typically a combination of more than one methacrylate compound, and typically is selected from methyl methacrylate, t-butyl methacrylate, methacrylic acid, or combinations thereof, although other methacrylate compounds are included in the present invention. The polyhedral oligosilsequioxane component is typically selected from 3-(3,5,7,9,11,13,15-heptacyclopentylpentacyclo-[9.5.1.1$^{3,9}$.1$^{5,15}$.1$^{7,13}$]octasiloxane-1-yl)propyl methacrylate (abbreviated propyl-POSS-methacrylate); 3-[(3,5,7,9,11,13,15-heptacyclopentylpentacyclo-[9.5.1.1$^{3,9}$.1$^{5,15}$.1$^{7,13}$]-octasiloxan-1-yloxy)dimethylsilyl]propyl methacrylate (abbreviated methacrylcyclopentyl-POSS); 1,3,5,7,9,11,13-heptacyclopentyl-15vinylpentacyclo-[9.5.1.1$^{3,9}$.1$^{5,15}$.1$^{7,13}$] octasiloxane (abbreviated vinyl-POSS), or combinations thereof. However, other silica cage compounds that contain polymerizable groups are encompassed by the present invention, as are various other inorganic clusters containing polymerizable groups. For example, there are a number of iron, cobalt, chromium, nickel, molybdenum, tungsten, platinum, palladium, boron, tin, ruthenium, osmium, rhodium, iridium, rhenium, niobium, and tantalum clusters with pendant polymerizable groups that are encompassed by the present invention.

Further examples of POSS molecules that contain olefinic type polymerizable groups, including simple -ene groups, acrylate and methacrylate functional groups, and norbornenyl groups, that may be used in this resist architecture are presented in Table 1 below. POSS molecules that incorporate a polymerizable epoxide moiety may also be used to construct this resist polymer. The examples of Table 1 are not intended to be limiting, but rather representative of the types of nanoparticles, especially metal oxide nanoparticles, that may be employed. Thus, suitable nanoparticles must be nanometer-sized (about 1–100 nm) and contain a pendent polymerizable group. Particles containing at least one metal or at least one non-metal element are preferred, therefore particles of metal borides, carbides, silicides, nitrides, phosphides, arsenides, oxides, sulfides, selenides, tellurides, or halides (fluorides, chlorides, bromides, or iodides) are preferred, as long as the nanoparticle contains any pendent polymerizable groups required for incorporation into the resist polymer.

TABLE 1

Figure 2:
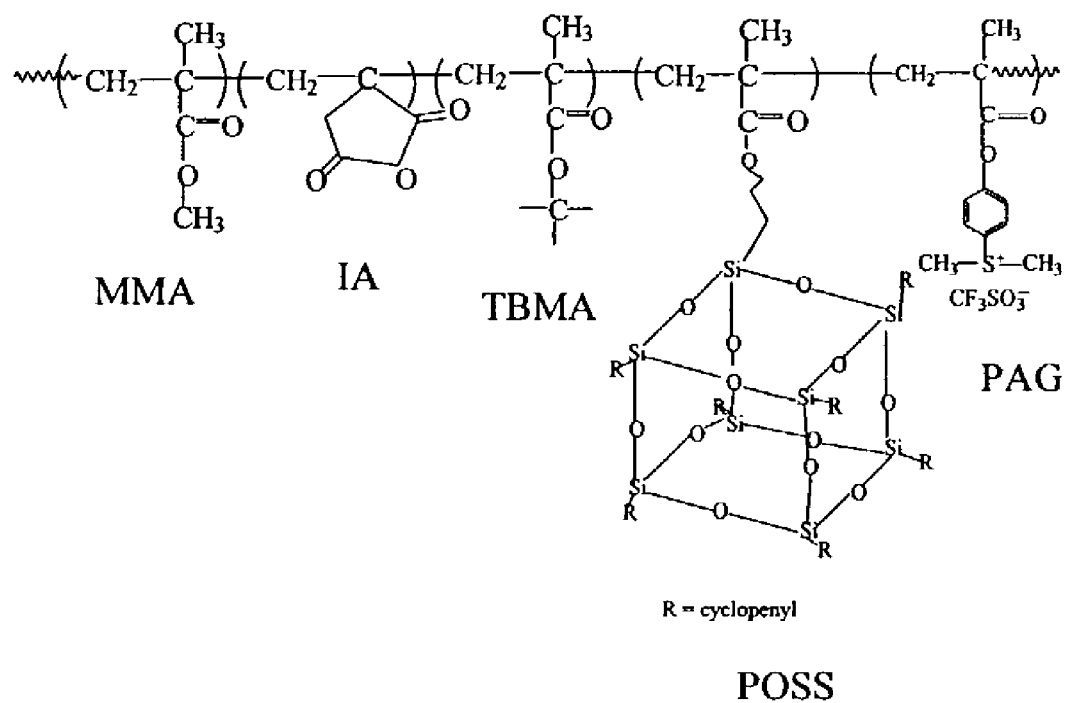
FIG. 2 illustrates the microstructure of one embodiment of a MMA/IA/TBMA/POSS/PAG copolymer of the present invention.

Further Examples of Ene-Functionalized POSS Molecules Used for Preparing the Nanocomposite Negative Resists of FIGS. 1 and 2.

| Structure | R Substitutent | Name |
|---|---|---|
| [POSS cage structure with allyl group] | Cyclohexyl | Allylcyclohexyl-POSS |
| | Cyclopentyl | Allylcyclopentyl-POSS |
| | i-butyl | Allylisobutyl-POSS |

TABLE 1-continued

Further Examples of Ene-Functionalized POSS Molecules Used for
Preparing the Nanocomposite Negative Resists of FIGS. 1 and 2.

| Structure | R Substitutent | Name |
|---|---|---|
| (structure) | Cyclohexyl | Tris(dimethylvinyl)cyclohexyl-POSS |
|  | cyclopentyl | Tris(dimethylvinyl)cyclopentyl-POSS |
|  | i-butyl | Tris(dimethylvinyl)isobutyl-POSS |
| (structure) | Cyclohexyl | Acrylocyclohexyl-POSS |
|  | Cyclopentyl | Acrylocyclopentyl-POSS |
|  | i-butyl | Acryloisobutyl-POSS |
| (structure) | Cyclohexyl | Methacrylcyclohexyl-POSS |
|  | Cyclopentyl | Methacrylcyclopentyl-POSS |
|  | i-butyl | Methacrylisobutyl-POSS |
|  | i-octyl | Methacrylisooctyl-POSS |
| (structure) | Cyclohexyl | Norbornenylethylcyclohexyl-POSS |
|  | cyclopentyl | Norbornenylethylcyclopentyl-POSS |
|  | i-butyl | Norbornenylethylisobutyl-POSS |

An illustration or schematic of the microstructure of one embodiment, a copolymer containing methyl methacrylate (MMA), t-butyl methacrylate (TBMA), methacrylic acid (MAA), and the polyhedral oligosilsesquioxane, 3-(3,5,7,9,11,13,15-heptacyclopentylpentacyclo-[9.5.1.1$^{3,9}$.1$^{5,15}$.1$^{7,13}$] octasiloxane-1-yl)propyl methacrylate (propyl methacrylate POSS), is presented in FIG. 1. While not wanting to be bound by this statement, it is believed that because this MMA/TBMA/MAA/POSS copolymer incorporates an inorganic moiety, here the POSS™ moiety with a cluster or cage-like structure, is more etch resistant than organic units without such a moiety. In addition, the silica cage of the POSS unit is surrounded by bulky cyclopentyl groups in this particular propyl methacrylate POSS, which could afford POSS even higher etch resistance.

General details of the preparation of a methacrylate-based CA resist incorporating a polyhedral oligosilsesquioxane (POSS) component are presented in Example 1, and Example 2 describes the characterization of these methacrylate-based CA resists. Table 2 presents the relative weight percents of components loaded into the mixture to be polymerized, and the percent composition of that component in the resulting polymer, for four representative resist samples with various POSS content. Table 2 also presents the glass transition temperatures (Tg), weight-average molecular weights ($M_W$), and polydispersity indices (PDI) of each representative polymer sample.

In one embodiment, the POSS component is incorporated into the CA resist of the present invention from about 1% to about 40% by weight in the polymer, although a POSS content of from about 10% to about 35% by weight in the polymer is preferable. Polymers prepared according to this invention are typically characterized by a glass transition temperature greater than about 165° C. and a weight-average molecular weights ($M_W$) greater than about 100,000 g/mol, although those polymers outside these ranges are encompassed herein.

One primary purpose of incorporating POSS units into the polymer matrix is to increase their reactive ion etch (RIE) resistance, and Example 3 and Table 3 record the polymer etch data for all four representative samples presented in Table 2. As these results indicate, all four samples exhibited a similar etch resistance regardless of their varied POSS contents, in the $CF_4$ plasma tests. One possible explanation for this observation is that the POSS silica cage is not resistant to the $CF_4$ plasma, as suggested by the fact that the Si—F bond is an extremely stable single bond. On the other hand, the POSS unit content is observed to affect the polymers' etch resistance in the $O_2$ plasma. When the POSS content is 12.5 wt %, no RIE enhancement is observed. When this content increases to 22.5 wt %, a significant improvement is observed. Further increase in the POSS units to 30.5 wt % gives a etch rate nearly one-third (⅓) of that measured for the sample containing no POSS units that was used as a reference for the RIE comparison.

An examination of these samples by high resolution transmission electron microscopy (HRTEM) indicated morphology differences in those resists that contained the POSS moieties at different weight percents. While not wanting to be bound by the following statement, it is believed that the morphologies observed by HRTEM are responsible for the different plasma etch behavior of the POSS-containing polymers. Thus, the POSS units in the low-concentration POSS samples appeared to associate to create discrete crystallites with small domain dimensions that would be inefficient to plasma erosion. As the POSS contents increased, the POSS units in the polymer assume a different morphology. In this case, a network of large, rectangular crystallites formed and uniformly distributed within the polymer matrix by association of the silica cages of the POSS units. This network of crystallites is believed to afford efficient protection against the $O_2$ plasma etching.

While not wanting to be bound by the following statement, it is believed that the effectiveness of the POSS units in improving the RIE resistance in the $O_2$ plasma lies in the intrinsic structure of the POSS units, that includes a silica cage and seven cyclopentyl groups around the cage corners. It is well accepted that inorganic molecules generally have higher resistance than organic molecules, and when combined with the steric bulk of the cyclopentyl groups, improved RIE resistance in the $O_2$ plasma results.

The lithographic properties of the POSS-containing samples were also evaluated under UV irradiation at a wavelength of 248 nm, and electron beam irradiation at 20 KeV, in which thin resist films were spin cast onto silicon wafers from PGME (Polypropylene glycol methyl ether) solutions. It was observed by exposure experiments that incorporation of this largely inorganic POSS component has not decreased the sensitivity of the resists under electron beam lithography. The imaging experiments are outlined in Example 4.

It is noted that other POSS components could be incorporated into the methacrylate-based CA resist according to the method of Example 1, as indicated in Example 5. For example, additional POSS components that could be used include, but are not limited to 3-[(3,5,7,9,11,13,15-heptacyclopentyl-pentacyclo-[$9.5.1.1^{3,9}.1^{5,15}.1^{7,13}$]-octasiloxan-1-yloxy)dimethylsilyl]propyl methacrylate (abbreviated dimethylsilyloxy(propyl)methacrylate-POSS) and 1,3,5,7,9,11,13-heptacyclopentyl-15vinylpentacyclo-[$9.5.1.1^{3,9}.1^{5,15}.1^{7,13}$]-octasiloxane (abbreviated vinyl-POSS). In addition, structurally similar POSS compounds, in which the silicon atoms at the corners of the POSS cage are substituted with R groups other than cyclopentyl, could be used in the preparation of methacrylate-based CA resists according to the present invention. Thus, in FIG. 1, POSS components could be used wherein R is selected from alkyl, cycloalkyl, aryl, alkenyl, alkynyl, aralkyl, aralkenyl, heteroalkyl, heterocycloalkyl, substituted derivatives thereof, combinations thereof, or similar substituents.

2. Chemically Amplified (CA) Resists with Photoacid Generating Groups (PAGs) Incorporated in the Resist Chains To alleviate the problems associated with simply adding monomeric photoacid generating groups (PAGs) into CA resist films outlined above, the present invention incorporates photoacid generating units directly into the polymeric resist chains as part of the polymeric unit.

In one embodiment of these CA resists, tert-butyl methacrylate (TBMA) was used as a protecting group, although similarly operable protecting groups could be used. Polyhedral oligosilsequioxane methacrylate (POSS) components were incorporated in some samples to achieve higher plasma etch rate required for pattern transfer, however it is to be understood that it is not necessary to incorporate POSS components in this embodiment of the present invention. These nanocomposite CA resists further incorporate a proprietary PAG monomer in the polymeric chain, to provide a resist that has been successfully tested for LVEBL (low voltage electron beam lithography), EUVL, VUV, and XRL as well as IBL.

In addition, silica nanoparticles can be blended in for enhanced etch resistance to provide another embodiment. In this latter embodiment, silica nanoparticles is used to refer to particles of silica $SiO_2$ that are nanometer scale (typically 1–100 nm), but also includes discrete molecular clusters that containing oxygen and at least one silicon atom, such as polyhedral oligosilsesquioxanes (POSS). These silica nanoparticles are blended, rather than co-polymerized.

A PAG monomer containing a photosensitive sulfonium unit coupled with a vinyl (methacrylate) polymerizable group, viz. [p-$CH_2$~C($CH_3$)C(O)O$C_6H_4$S$Me_2$]O$SO_2CF_3$, was synthesized according to Example 6, and shown in the reaction scheme below. The vinyl (methacrylate) polymerizable group was selected to make the PAG monomer compatible with common methacrylate compounds found in CA resists. Resist samples were then prepared by co-polymerization of the PAG component with various methacrylate compounds as indicated in Example 7, with the components and corresponding compositions of representative samples listed in Table 4 and Example 8. The methacrylate component is typically a combination of more than one methacrylate compound, usually selected from methyl methacrylate, t-butyl methacrylate, methacrylic acid, or combinations thereof, although other methacrylate compounds are included herein. The photoacid generating component typically contains a sulfonium group, but other photoacid generating compounds, such as iodonium are encompassed by this invention.

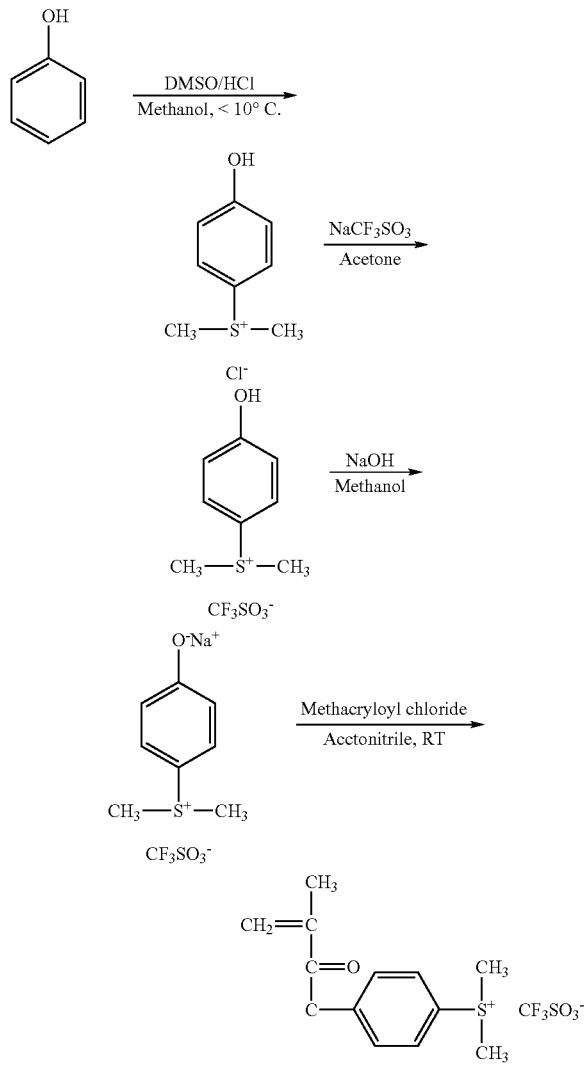

In one embodiment, the chemically amplified resist of the present invention further comprises a dissolution promoter. While a range of promoters are envisioned, itaconic anhydride (IA) is one preferred dissolution promoter, which functions effectively in tetramethylammonium hydroxide solutions.

One embodiment of the present invention optionally incorporates a POSS component with a polymerizable group for incorporation into the resist polymeric chaim, as illustrated in Example 7. When present, the polyhedral oligosilsequioxane component is typically selected from 3-(3,5,7,9,11,13,15-heptacyclopentylpentacyclo[9.5.1.1$^{3,9}$.1$^{5,15}$.1$^{7,13}$]octasiloxane-1-yl)propyl methacrylate; 3-[(3,5,7,9,11,13,15-heptacyclopentylpentacyclo-[9.5.1.1$^{3,9}$.1$^{5,15}$.1$^{7,13}$]-octasiloxan-1-yloxy)dimethylsilyl]propyl methacrylate; 1,3,5,7,9,11,13-heptacyclopentyl-15-vinylpentacyclo-[9.5.1.1$^{3,9}$.1$^{5,15}$.1$^{7,13}$]octasiloxane, or combinations thereof. However, other silica cage compounds that contain polymerizable groups are encompasses by the present invention.

When present in the chemically amplified resist, the polyhedral oligosilsequioxane component is present from about 1% to about 35% by weight in the polymer, typically from about 10% to about 32% by weight in the polymer. Additionally, the photoacid generating component is present from about 2% to about 25% by weight in the polymer, typically from about 5% to about 20% by weight in the polymer. Polymers prepared according to this invention are typically characterized by a weight-average molecular weights ($M_w$) varying from 20,000 to 100,000 g/mol and a polydispersity index between 1 and about 2, although those polymers outside these ranges are encompassed by the present invention.

In one embodiment of this invention, the CA resist comprises methyl methacrylate, t-butyl methacrylate, methacrylic acid, 3-(3,5,7,9,11,13,15-heptacyclopentylpentacyclo-[9.5.1.1$^{3,9}$.1$^{5,15}$.1$^{7,13}$]-octasiloxane-1-yl)propyl methacrylate, and [p-CH$_2$~C(CH$_3$)C(O)OC$_6$H$_4$SMe$_2$] OSO$_2$CF$_3$. In another embodiment, this invention includes a dissolution promoter, and therefore comprises methyl methacrylate, t-butyl methacrylate, methacrylic acid, itaconic anhydride, 3-(3,5,7,9,11,13,15-heptacyclopentylpentacyclo-[9.5.1.1$^{3,9}$.1$^{5,15}$.1$^{7,13}$]-octasiloxane-1-yl)propyl methacrylate, and [p-CH$_2$~C(CH$_3$)C(O)OC$_6$H$_4$SMe$_2$]—OSO$_2$CF$_3$.

To evaluate the lithographic properties of the resists, thin films were cast on silicon wafers to a typical film thickness of about 0.3 to about 0.5 μm. All resists samples had excellent film formation behavior. No pinholes were observed even with a film thickness of below 100 nm. This observation behavior could be attributed to the absence of phase separation frequently observed for CA resists containing a high percentage of small-molecule PAGs that are not incorporated directly into the polymeric resist chains as part of the polymeric unit.

Table 3 presents the relative weight percents of components loaded into the mixture to be polymerized, and the percent composition of that component in the resulting polymer, for three representative resist samples with various PAG and POSS content. Table 4 also presents the weight-average molecular weights ($M_w$) and polydispersity indices (PDI) of each polymer sample.

An illustration or schematic of the microstructure of one embodiment of this invention, viz. a copolymer containing methyl methacrylate (MMA), t-butyl methacrylate (TBMA), the polyhedral oligosilsesquioxane propyl methacrylate POSS, itaconic anhydride, and the PAG group [p-CH$_2$~C (CH$_3$)C(O)OC$_6$H$_4$SMe$_2$]OSO$_2$CF$_3$ is presented in FIG. 2.

The resist films of this invention were first exposed on an EX7 DUV 248 nm Excimer Laser stepper at a wavelength of 248 nm. Typical processing conditions are presented in Example 9 and details of the imaging experiments for this type photoresist are provided in Example 10. High resolution SEM micrographs of patterns obtained for samples at a dose of 5 mJ/cm$^2$ were compared for those samples that incorporated itaconic anhydride and those that did not. Itaconic anhydride (IA) functions as a dissolution promoter in TMAH solutions, and samples containing IA developed properly in either 0.21 or 0.26 N TMAH solutions. In contrast, samples that contained no IA dissolution promoter developed equally well in 0.26 N TMAH, most probably due to high conversion of tert-butyl group into an acid (—COOH) group.

All resist samples had a wide processing window in terms of post-exposure-bake (PEB) temperatures under both 248 nm deep UV and electron beam exposures. A series of PEB temperatures, namely 110, 120, 125 and 130° C. were applied, while maintaining the other processing parameters the same. The image quality obtained using different PEB temperatures was indistinguishable. Additionally, most samples were found to be relatively insensitive to TMAH concentrations. For example, different TMAH solution concentrations, from about 0.1 N to about 0.26 N, were equally effective for developing sample 8a in Table 4.

The resists were also found to be very sensitive to electron beam radiation. The imaging experiments were carried out on a Leo 982 SEM with a Nabity pattern generator at 20 keV. The processing conditions were almost identical to the photo-exposure at 248 nm. All samples exhibited very high sensitivity under both 248 nm deep-UV and 20 keV electron exposures. It is believed that the high sensitivity is attributable to the high loading of photoacid generator in the resists, which was made possible by incorporation of PAG units in the polymer chains. Without such incorporation directly into the polymer chains, phase separation would otherwise occur at high PAG loading levels.

3. New Negative Resist Architectures Incorporating Functionalized Poly(styrene)-Photoacid Generator (PAG) Co-Polymers with Optional Polyhedral Oligosilsesquioxane (POSS™) Moieties The notion of incorporating photoacid generating units directly into the polymeric resist chain as part of the polymeric unit can be extended in the following design of new negative resist architectures. These new compositions are based on various polymeric styrene derivatives in which the PAG moiety and the functionalized styrene are co-polymerized. This new negative resist design alleviates the problems associated with simply admixing monomeric photoacid generating groups (PAGs) into resist films, as described above.

In one embodiment, the styrene component that forms the major proportion of monomer in this resist is tetrahydropyranyl oxystyrene (THPS). In another embodiment, a mixture of tetrahydropyranyl oxystyrene (THPS) and p-hydroxystyrene (PHS) monomers is co-polymerized to form the styrene component, although PHS may also be used in the absence of THPS. A wide range or substituents on the styrene monomer are possible, and can be adjusted according to well-known and basic chemical principles to impart the desired properties to the resultant polymer such as solubility, polarity, or crystallinity. Further, it is not necessary to use the para-hydroxystyrene (PHS) monomer in this invention, as meta-hydroxystyrene (MHS) monomer, and any number of other hydroxy-functionalized olefinic monomers, wherein the hydroxy functionality is not required to be bonded to an olefinic phenyl substituent, are also useful.

The PAG monomer described above, [p-$CH_2$~$C(CH_3)$C(O)$OC_6H_4SMe_2$]—$OSO_2CF_3$, synthesized according to Example 6, was used as the preferred PAG monomer. This monomer contains both a photosensitive sulfonium unit coupled with a vinyl (methacrylate) polymerizable group, to make the PAG monomer compatible with common methacrylate or styrene derivatives for use in new resists.

In one embodiment of these resists, tert-butyl methacrylate (TBMA) was used as a protecting group, although similarly operable protecting groups could be used. The methacrylate component can also be a combination of more than one methacrylate compound, usually selected from methyl methacrylate, t-butyl methacrylate, methacrylic acid, or combinations thereof. Polyhedral oligosilsequioxane methacrylate (POSS) components were optionally incorporated into some samples to achieve higher plasma etch rate required for pattern transfer, although it is not necessary to incorporate the methacrylate or the POSS components in this embodiment of the present invention.

Examples 11 and 12 describe the preparation of functionalized styrene precursors for the negative resists of this embodiment. Example 11 provides details for preparing tetrahydropyranyl ether benzyldehyde (THPB) and Example 12 discloses how THBP is converted to the tetrahydropyranyl oxystyrene (THPS) monomer. Example 13 details the deprotection of tetrahydropyranyl oxystyrene (THPS) monomer to form p-hydroxystyrene monomer (PHS). Examples of polymerization reactions of tetrahydropyranyl oxystyrene (THPS) monomer and p-hydroxystyrene monomer (PHS) are described in Example 14 for poly(tetrahydropyranyl oxystyrene) (poly-THPS) and in Example 15 for poly (p-hydroxy styrene) (poly-PHS). Table 5 illustrates the polymer loading for photoresist formulations using newly developed styrene and PAG monomers under free radical polymerization conditions, emphasizing the optional nature of the methacrylate component and the POSS component. In Table 5, the amounts of monomers are provided as a weight percent, and in each case, 1% AIBN (by weight) was used as free radical polymerization initiator. These resists are useful for LVEBL, EUVL, VUV, and XRL as well as IBL lithographic methods. When this embodiment is used for VUV lithographic methods, a larger portion (mole % or weight %) of POSS is incorporated into the resist architecture, because the Si—O structure increases the material's transparency to 157 nm radiation.

As outlined above, silica nanoparticles can be blended in for enhanced etch resistance to provide another embodiment of this invention. In this latter embodiment, silica nanoparticles is used to refer to particles of silica $SiO_2$ that are nanometer scale (typically 1–100 nm), but also includes discrete molecular clusters that containing oxygen and at least one silicon atom, such as polyhedral oligosilsesquioxanes (POSS). In this latter embodiment, the final resist can contain two types of POSS moieties, a first co-polymerized POSS component, and a second blended POSS component.

In a typical negative resist polymer of this invention, the polymer is prepared from about 5–20% by weight of the photoacid generating component, about 70–90% by weight of the styrene component, and about 3–20% by weight of the polyhedral oligosilsequioxane component. More typically, the negative resist polymer of this invention is prepared from about 5–15% by weight of the photoacid generating component, about 70–85% by weight of the styrene component, and about 10–15% by weight of the polyhedral oligosilsequioxane component.

Examples 14 illustrates this embodiment using the POSS monomer 3-(3,5,7,9,11,13,15-heptacyclopentylpenta-cyclooctasiloxyanyl) propyl methacrylate. Any POSS monomer that contains a polymerizable group that is amenable to the particular polymerization method, in this case free-radical polymerization, can be used in this invention. For example, POSS molecules that contain simple olefinic (or -ene) pendant groups, methacrylate or acylate polymerizable groups, cyclic-ene groups such as norbornene may be used in the resist formulations in this embodiment. Even POSS molecules that contain epoxide groups that can be polymerized may be used in this embodiment. Accordingly, Tables 1 and 5 provide examples of POSS monomers that contain polymerizable groups that may be incorporated in the resist polymers, which are presented for illustrative purposes only, and are not intended to constitute a limitation on the nanoparticle components in the resists.

4. Cross-Linked Non-Chemically Amplified Negative Resists Incorporating Polyhedral Oligosilsesquioxane (POSS™) and Photoacid Generators (PAGs) into New Resist Architectures The present invention further addresses the lack of reactive ion etch (RIE) resistance necessary for pattern transfer in simple methacrylate-based CA resists, by providing new resist architectures that rely on novel cross-linking chemistry to generate non-chemically amplified (non-CA) negative resists, usually for 13 nm lithography. These new architectures are provided by permutations of polymerization and cross-linking reactions that advance a fundamentally new resist design. This design provides stability to the high-aspect ratio and dense patterns required for commercial resists in sub-100 nm resolution, and address the line edge roughness that can hinder the applicability of many EUV or VUV resists. Moreover, these designs reduce the electron proximity effects and line broadening in EBL or EUVL processes, without requiring the modification of current EBL or EUVL exposure machines. Further, the transparency of commercial resists to 13 nm radiation is greatly improved in these novel architectures.

To accomplish these tasks, the present invention synergistically combines organic and inorganic resist designs in the following way. One embodiment of this invention avoids the use of methacrylate components altogether and tailors a non-chemically amplified resist structure by incorporating polyhedral oligosilsesquioxane (POSS™) clusters and photoacid generators (PAGs) into a cross-linked structure. It is the aim of the resulting nanoscale composite to achieve a truly molecular level of dispersion of both the POSS moieties and the PAG units, as well as maintaining the desired degree of control over polymer properties for processing purposes.

In one embodiment, this design is based on two polymeric components, namely an epoxy-containing POSS monomer co-polymerized with a monomeric PAG to form a first polymer, and a low molecular weight poly(hydroxystyrene) (poly-PHS) second polymer. These two components, shown in FIG. 3, undergo a rapid cross-linking reaction in the presence of the PAG component. The epoxy moieties are pendent to the inorganic POSS clusters incorporated in the polymer chain. The cross-linking chemistry is based on the epoxide functionality in the POSS/PAG polymeric system, which provides the desired cross-linked network upon alcoholysis reaction with the poly(p-hydroxystyrene) (poly-PHS) polymer. The POSS moiety in the first polymer typically contains 2–3 pendent epoxide functional groups. This design achieves a molecular level of dispersion of both the POSS moieties and the PAG units, forming a true nanoscale composite, while permitting the properties of the polymer to be tuned by the polymerization conditions, the component polymer molecular weight, and the like. As a result, chemical stripping can be performed using standard wet development protocols because of the tenability of the cross-link density.

Examples 11 and 12 describe the preparation of precursors for p-hydroxy styrene (PHS) and poly-PHS. Example 11 provides details for preparing tetrahydropyranyl ether benzyldehyde (THPB) and Example 12 discloses how THBP is converted to the tetrahydropyranyl oxystyrene (THPS) monomer. Example 13 details the deprotection of tetrahydropyranyl oxystyrene (THPS) monomer form p-hydroxystyrene monomer (PHS). Both tetrahydropyranyl oxystyrene (THPS) monomer and p-hydroxystyrene monomer (PHS) are used in the preparation of the negative photoresists of this invention. The cross-linking reaction is described in Example 16 for cross-linking the POSS/PAG polymer with the PHS polymer/oligomer. Example 17 provides details for preparing a PHS-PAG copolymer and cross-linking the copolymer with a POSS epoxide monomer.

Figure 3:
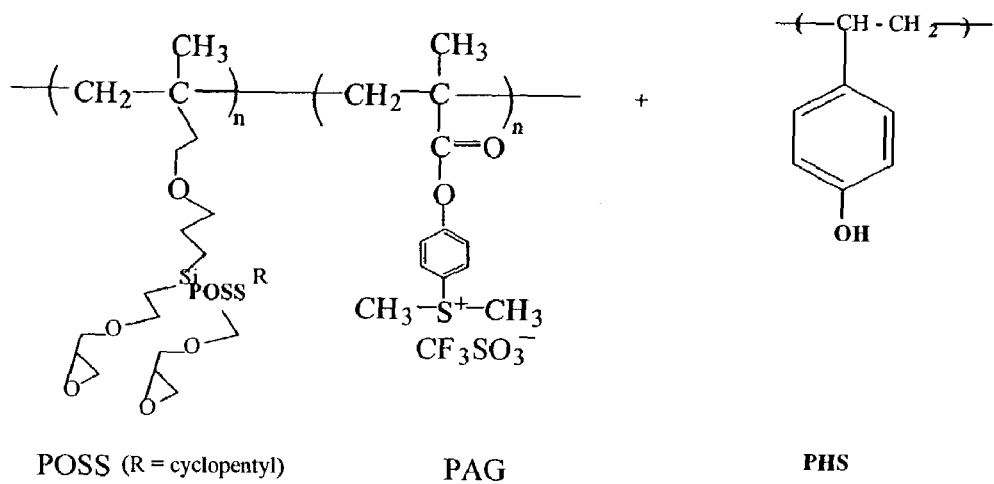
FIG. 3 illustrates one embodiment of a cross-linking reaction to form a POSS-PAG-PHS copolymer of the present invention. In this embodiment, the pendant group that contains the $Si_{POSS}^R$ moiety represents any POSS-type species with a polymerizable group with pendant epoxide groups as required by the context and as disclosed herein.

A PAG monomer containing a photosensitive sulfonium unit coupled with a vinyl (methacrylate) polymerizable group, [p-CH$_2$~C(CH$_3$)C(O)—OC$_6$H$_4$SMe$_2$]OSO$_2$CF$_3$, synthesized according to Example 10, is used in FIG. 3 as one polymer component. The vinyl (methacrylate) polymerizable group of the PAG monomer polymerized readily with an olefinic moiety on the desired POSS monomer, while allowing pendant epoxy moieties on each POSS to remain intact for the cross-linking reaction. The photoacid generating component typically contains a sulfonium group, but other photoacid generating compounds, such as iodonium are encompassed by this invention. In one embodiment, the chemically amplified resist of the present invention further comprises a dissolution promoter. While a range of promoters are envisioned, itaconic anhydride is one preferred dissolution promoter, which functions effectively in tetramethylammonium hydroxide solutions.

Figure 4:
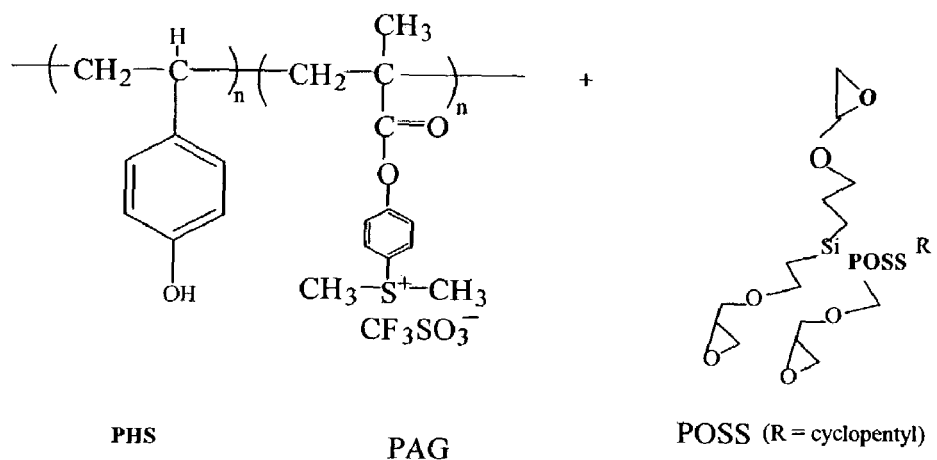
FIG. 4 illustrates another embodiment of a cross-linking reaction to form a PHS-POSS-PAG copolymer of the present invention. In this embodiment, the compound that includes the $Si_{POSS}^R$ moiety represents any POSS-type species with pendant epoxide group ssuch as those as disclosed herein.

Any number of polyhedral oligosilsesquioxane (POSS™) components can be employed in FIGS. 3 and 4, if they comprise a polymerizable moiety that enables incorporation into the first polymer, and a cross-likable group that enables incorporation in the second polymer. FIG. 3 illustrates the use of a POSS with a polymerizable olefin (-ene) group that facilitates the first polymerization reaction and assimilation of the POSS within the first polymer, wherein the POSS also contains pendent epoxy groups to facilitate the cross-linking reaction. Table 6 illustrates several examples of epoxide-containing POSS nanoparticles that can be used in the present invention, such that after a first polymerization with a monomeric PAG to form a first polymer, each POSS moiety still retains at least one epoxide to provide the cross-linked network upon reaction with the poly(hydroxystyrene) (poly-PHS) polymer. Typically, after a first polymerization, each POSS moiety retains at least two epoxide functionalities. Cross-linking is driven by the alcoholysis reaction between the epoxy groups and the para hydroxy groups of the poly-PHS. The compounds presented in Table 5 are illustrative of the types of epoxy-functionalized POSS molecules that can be used for preparing the nanocomposite negative resists for both FIGS. 3 and 4. Although FIG. 3 shows a POSS-containing polymer, formed from an olefin-containing POSS with pendent epoxy groups, an epoxy group may also be polymerized form the POSS-PAG first polymer, while additional epoxide pendent groups facilitate the cross-linking chemistry.

The epoxy monomer is based on a three dimensional POSS aggregate structure which has diameter of 1–3 nm, typically about 2 nm. Once cross-linking is undertaken, this synthetic strategy leads to a molecular weight (Mw) of the resist components in the range of about 2000 to about 5000 Daltons. This polymer molecular weight provides the necessary polymer properties for suppressing line edge roughness. The POSS moieties in the POSS-containing polymers described herein seem to be effective in improving the etch resistance of the resulting resists.

5. Alternative Resist Architectures for Cross-Linked Non-Chemically Amplified Negative Resists Incorporating Polyhedral Oligosilsesquioxane (POSS™) and Photoacid Generators (PAGs)

Another fundamentally new way to synergistically combine organic and inorganic resist designs is provided in the following alternative embodiment of a cross-linked negative non-CA resist, that still incorporates polyhedral oligosilsesquioxanes (POSS™) and photoacid generators (PAGs). This embodiment of the invention also typically avoids the use of methacrylate components and provides a nanoscale composite with a molecular level of dispersion of both the POSS moieties and the PAG units.

TABLE 6

Examples of Epoxy-Functionalized POSS Molecules Used for Preparing the Nanocomposite Negative Resists of FIGS. 3 and 4.

| Structure | R Substitutent | Name |
| --- | --- | --- |
|  | Cyclohexyl | EpoxycyclohexylCyclohexyl-POSS |
|  | Cyclopentyl | EpoxycyclohexylCyclopentyl-POSS |
|  | i-butyl | Epoxycyclohexylisobutyl-POSS |
|  | i-butyl | Epoxycyclohexyldisilanol-isobutyl-POSS |
|  | — | Epoxycyclohexyl-POSS Cage (available as a mixture of 8-, 10- (shown), and 12- Epoxycyclohexyl-substituted |
|  | Cyclopentyl | Epoxypropylcyclopentyl-POSS |
|  | i-butyl | Epoxypropylisobutyl-POSS |

TABLE 6-continued

Examples of Epoxy-Functionalized POSS Molecules Used for
Preparing the Nanocomposite Negative Resists of FIGS. 3 and 4.

| Structure | R Substitutent | Name |
|---|---|---|
| | Cyclopentyl | Glycidylcyclopentyl-POSS |
| | Ethyl | Glycidylethyl-POSS |
| | i-butyl | Glycidylisobutyl-POSS |
| | i-octyl | Glycidylisooctyl-POSS |
| | — | Octaepoxycyclohexyl-dimethylsilyl-POSS |
| | — | Octaglycidyldimethylsilyl-POSS |

TABLE 6-continued

Examples of Epoxy-Functionalized POSS Molecules Used for
Preparing the Nanocomposite Negative Resists of FIGS. 3 and 4.

| Structure | R Substitutent | Name |
|---|---|---|
| [chemical structure] | Cyclopentyl | Trisglycidylcyclopentyl-POSS |
| | Ethyl | Trisglycidylethyl-POSS |
| | i-butyl | Trisglycidylisobutyl-POSS |

The resist design in this embodiment is also based on two polymeric components, wherein one polymer is generated by copolymerization of the hydroxystyrene (PHS) monomer and a PAG monomer to form a poly(PHS-PAG) first polymer. The first polymer is then crosslinked due to the presence of PAG, using the POSS epoxide monomers that contain at least two pendent epoxy groups to facilitate its cross-linking function, as illustrated in FIG. 4. It is not necessary to form large polymers of poly (PHS-PAG) from the p-hydroxystyrene (PHS) monomer and the PAG monomer, but rather an oligo(PHS-PAG) material that constitutes a much lower molecular weight co-oligomer of these monomers may be employed in cross-linking with the POSS epoxide monomer. As used herein, the terms oligo- or a poly (PHS-PAG) are used interchangeably to represent either a polymer or an oligomer material.

The epoxy monomers are pendent to the inorganic POSS clusters in this embodiment, but are not incorporated into the polymeric resist material until the final cross-linking step. The multifunctional POSS epoxide provides the desired cross-linked network upon reaction with the poly(hydroxystyrene-PAG) first polymer. This design also achieves a molecular level of dispersion of both the POSS moieties and the PAG units, forming a true nanoscale composite, while permitting the properties of the polymer to be tuned by the polymerization conditions, the component polymer molecular weight, and the like. As a result of the molecular level of dispersion and the control over polymer properties, chemical stripping can be performed using standard wet development protocols because of the tenability of the cross-link density.

The PAG vinyl (methacrylate) polymerizable group polymerized readily with the olefinic moiety of the p-hydroxystyrene, while providing the pendent hydroxy group on the PHS portion of the oligomer/polymer for cross-linking with the POSS epoxide monomer. Similarly, in another embodiment, an -ene functionalized POSS group, especially a vinyl or allyl functionalized POSS group can be crosslinked with H-silsesquioxane (HSQ) using a variety of photoinitiators for fast curing of the polymer. Examples of epoxy-functionalized POSS groups that can be used in this embodiment are provided in Table 6, and include any of the compounds shown, their analogues and derivatives, and combinations thereof.

6. Further Resist Architectures for Cross-Linked, Chemically Amplified Negative Resists Incorporating Polyhedral Oligosilsesquioxane (POSS™), Photoacid Generators (PAGs), and Methacrylate Monomers Other embodiments of this invention which synergistically combine organic and inorganic resist designs are provided in the following alternative embodiments of a cross-linked, chemically-amplified (CA) negative resist. These new resist structures incorporate the new POSS molecules described above.

In one embodiment, a "first polymer" as represented by the polymer of FIG. 1 which contains the methacrylic acid (MAA) moiety, is prepared according to Example 1 and as described above. This polymer is subsequently cross-linked with either the POSS-PAG polymer shown in FIG. 3, or with a multi-epoxide functionalized POSS molecule such as those presented in Table 6.

In another embodiment, a "first polymer" as illustrated by the polymer of FIG. 2 is prepared according to Example 7 and as described above, wherein the POSS moiety contains at least one pendent epoxy functional group. This pendent epoxy group is used for the subsequent cross-linking reaction using the poly- or oligo-PHS, as exemplified in Example 16.

The present invention is further illustrated by the following examples, which are not to be construed in any way as imposing limitations upon the scope thereof. On the contrary, it is to be clearly understood that resort may be had to various other embodiments, modifications, and equivalents thereof which, after reading the description herein, may suggest themselves to one of ordinary skill in the art without departing from the spirit of the present invention or the scope of the appended claims.

In these examples, the POSS™ (polyhedral oligomeric silsesquioxanes) nanoparticle materials were purchased from Hybrid Plastics™ Inc. (Fountain Valley, Calif.). Chemicals and solvents were purchased from Fisher Scientific or Aldrich Chemical Company. The initiator AIBN was recrystalized prior to use. Solvents tetrahydrofuran (THF)

and n-hexane was distilled priority to use. Materials used for preparation of the photoacid generating (PAG) monomeric component were obtained from Aldrich Chemical Company (Milwaukee, Wis.) and were used as received. HCl gas was generated in situ by the reaction of concentrated sulfuric acid (98%) and analytical-grade hydrochloric acid (36.5%). The HCl gas produced was dried by passing through concentrated $H_2SO_4$. The reagents 3,4-dihydro-2H-pyran, 4-hydroxy aldehyde, methyltriphenyl phosphonium bromide, and n-butyl lithium (n-BuLi) were purchased from Fisher Scientific (ACROS Chemical). The acid catalyst p-toluenesulphonic acid (TsOH) was supplied by Aldrich Chemical Company. Dichloromethane ($CH_2Cl_2$) was distilled over calcium hydride, tetrahydrofuran (THF) was distilled from sodium/benzophenone (2:1), and n-hexane was distilled from calcium hydride prior to use.

EXAMPLE 1

Preparation of a Methacrylate-Based CA Resist Incorporating a Polyhedral Oligosilsesquioxane (POSS).

All monomeric components used in the polymer preparation were purchased from Polysciences (Warrington, Pa.) or Aldrich (Milwaukee, Wis.). The liquid monomers, tert-butyl methacrylate (TBMA), methyl methacrylate (MMA), and methacrylic acid (MAA) were vacuum distilled under nitrogen prior to use. The inhibitor-free polyhedral oligosilsesquioxane, 3-(3,5,7,9,11,13,15-heptacyclopentylpentacyclo-[9.5.1.1$^{3,9}$.1$^{5,15}$.1$^{7,13}$]octasiloxane-1-yl)propyl methacrylate, abbreviated propyl methacrylate POSS, (Aldrich) was used as received. Tetrahydrofuran (THF) was distilled from sodium and benzophenone under nitrogen. Hexane was reagent grade and used as received. α,α'-Azobis(isobutyronitrile) (AIBN) was recrystallization twice from methanol prior to use. Polypropylene glycol methyl ether (PGME) was obtained from Aldrich and used as received. The developer AZ® MIF 300, obtained from AZ Electronics (Somerville, N.J.), was a 0.26 N aqueous solution of tetramethylammonium hydroxide (TMAH). Solutions of 0.02 N TMAH used as developers in this work were prepared by dilution of the 0.26 N TMAH solutions with deionized water. Triphenyl sulfonium hexafluoroantimonate, used as a photoacid generator (PAG) for resist formulation, was purchased from Polysciences as a 50 wt % solution in PGME.

All polymer samples were synthesized by AIBN-initiated free radical polymerization. A typical polymerization procedure is as follows. The monomers (typically 5 grams) and 1 wt % AIBN with respect to the total monomer weight, were dissolved in THF. The solution was filtered through a 0.5 μm Teflon microfilter into a sealed flask. Three successive freeze-pump-thaw cycles were run to remove oxygen from the sample. The clear solution was then placed in a 60° C. oil bath under stirring. The reaction was maintained under a nitrogen atmosphere for 1 day to achieve high conversion. After this time, the reaction mixture was added dropwise, with stirring, into sufficient hexane to precipitate the polymer. The polymer was filtered off and washed thoroughly with hexane. Samples of polymer isolated in this fashion were purified by reprecipitation from THF/hexane. Finally the samples were dried under vacuum at 60° C. for 1–2 days.

EXAMPLE 2

Characterization of a Methacrylate-Based CA Resist Incorporating a Polyhedral Oligosilsesquioxane (POSS).

The thermal stability of all samples was measured by a Perkin Elmer Thermogravimetric Analyzer 7 (TGA). TGA samples were heated at a rate of 20° C./min with an $O_2$ or $N_2$ gas flow rate of 25 cm$^3$/min. Glass transition temperatures (Tg) were measured by a Perkin Elmer Differential Scanning Calorimeter 7 (DSC). DSC samples were heated at a rate of 20° C./min. Molecular weights were measured by a Millipore Waters GPC using THF as an eluent and polystyrene calibration standards.

Polymer compositions were obtained by a combination of $^1$H NMR and TGA analyses. The $^1$H NMR spectra were obtained on a Bruker Win-500 NMR spectrometer using acetone-d$_6$ as a solvent. The relative composition of the monomers POSS, MMA, TBMA and MAA in a resulting polymer sample were calculated from the area ratios of their characteristic peaks. These data are presented below in Table 2. In parallel, the POSS content was also determined independently by TGA using the following procedure. Approximately 10 mg of polymer sample was placed on a TGA pan and heated at a heating rate of 20° C./min from room temperature to 800° C. in pure oxygen with a gas flow rate of 25 ml/min, and maintained at 800° C. for 0.5 h. The weight loss of the sample over this process was used to calculate the sample's POSS content, based upon the assumption that any residue remaining after burning the polymer sample in oxygen constituted pure silicon dioxide. This assumption was validated by burning the POSS monomer using the same procedure and performing the same calculations. By this procedure, the POSS monomer data, which was measured to have a 46.86% weight loss after burning, was well in agreement with the calculated value of 46.81%.

An illustration of the microstructure of a POSS/MMA/TBMA/MAA copolymer is presented in FIG. 1. Table 2 presents the relative weight percents of monomers loaded into the mixture to be polymerized, and the percent composition of that monomer in the resulting polymer. Table 2 also presents the glass transition temperatures (Tg), weight-average molecular weights ($M_W$), and polydispersity indices (PDI) of each polymer sample.

TABLE 2

Polymer composition and physical properties of the POSS-containing methacrylate co-polymers.

| Sample No. | Polymer Composition: Loading (In Polymer) wt % | | | | $T_g$ (° C.) | $M_w$ g/mol × 10$^5$ | PDI |
|---|---|---|---|---|---|---|---|
| | POSS | MMA | MMA | TBMA | | | |
| 2a | 10 (12.5) | 30 (24.7) | 20 (28.9) | 40 (33.8) | 170 | 1.82 | 1.51 |
| 2b | 20 (22.5) | 20 (17.3) | 20 (22.8) | 40 (37.5) | 179 | 1.80 | 1.43 |

TABLE 2-continued

Polymer composition and physical properties of the POSS-containing methacrylate co-polymers.

| Sample No. | Polymer Composition: Loading (In Polymer) wt % | | | | $T_g$ (° C.) | $M_w$ g/mol × $10^5$ | PDI |
|---|---|---|---|---|---|---|---|
| | POSS | MMA | MMA | TBMA | | | |
| 2c | 30 (30.5) | 10 (7.0) | 20 (24.6) | 40 (33.8) | 186 | 1.76 | 1.48 |
| 2d | 0 (0) | 40 (39.9) | 20 (12.6) | 40 (47.5) | 168 | 1.83 | 1.47 |

EXAMPLE 3

Etch Study and Polymer Morphology Characterization of a Methacrylate-Based CA Resist Incorporating a Polyhedral Oligosilsesquioxane (POSS).

Resist solutions (typically 5–10 wt %) were formulated by dissolving polymer samples, along with 2% by weight (relative to the polymer) of the photoacid generator (PAG) triphenyl sulfonium hexafluoroantimonate, in PGME. The low-POSS samples (<22.5% POSS) were readily soluble in PGME (Polypropylene glycol methyl ether) without heating, while the high-POSS sample (30.5%) must be heated to 40° C. to achieve fast dissolution. The resist solutions were filtered through a 0.2 µm Teflon micro filter to remove any undissolved residue.

Thin films were spin cast on 3-inch silicon wafers on a Brewer/CEE Model 6000 Wafer Processing Track System using a spinning speed of 1500 rpm and spinning times of 60 sec. The films were then baked on a hot plate at 125° C. for 3 min. After cooling to room temperature, the resist-coated wafer was placed in the plasma chamber of the etcher (Plasma Therm System 72 Reactive Ion Etcher), with half of the resist-coated wafer covered with a specially-fit glass slide. Typical etching conditions were 60 mtorr pressure, a power density of 0.25 W/cm$^2$, and either CF$_4$ or O$_2$ plasma gases, with gas flow rates of 12.6 and 30 sccm for CF$_4$ and O$_2$, respectively. Etch rates were calculated by dividing the thickness difference between the slide-covered and uncovered areas on the resist film by etch times, and are recorded in Table 4. Film thickness was measured on a Tencor AlphaStep 200 Surface Profilometer. Etching times were carefully selected to ensure that the uncovered area of the resist film was not entirely eroded away during the etch process.

High-resolution transmission electron microscopy (HR-TEM) samples were prepared from acetone solutions of the polymers and deposited on copper grids with a carbon film. HRTEM studies were performed on a JEOL-4000EX microscope with a point-to-point resolution of approximately 1.7 Å. The TEM images were obtained under optimum defocus conditions in which the atom columns appear as block dots. Images were digitized using a high-resolution camera and then computer-processed to reduce the noise arising from the matrix. HRTEM revealed that the RIE improvement was due to the formation of rectangular crystallite-constituting networks of the silica cages, uniformly distributed within the polymer matrix.

Table 3. Etch Rate Date for Methacrylate-Based CA Resist Incorporating a Polyhedral Oligosilsesquioxane (POSS).

TABLE 3

Etch Rate Date for Methacrylate-Based CA Resist Incorporating a Polyhedral Oligosilsesquioxane (POSS).

| Sample No. | POSS in polymer wt % | RIE Rate Å/min | |
|---|---|---|---|
| | | in O$_2$ | in CF$_4$ |
| 2a | 12.5 | 2500 | 835 |
| 2b | 22.5 | 1700 | 850 |
| 2c | 30.5 | 900 | 1167 |
| 2d | 0 | 2500 | 840 |

EXAMPLE 4

Imaging Experiments and Characterization of a Methacrylate-Based CA Resist Incorporating Polyhedral Oligosilsesquioxanes (POSS).

For imaging experiments, resist formulation and film preparation were the same as those described in Example 3 for etch study. Resist film that was spin-cast on 3-inch Si wafers from PGME solutions and were pre-baked at 125° C. for 2 min. All samples had good solubility in PGME, even though they contained inorganic side groups. The exposure experiments were performed on a Leo 982 SEM with a pattern generator using 20 KeV electron beam. Similar exposure experiments were performed using under UV irradiation at a wavelength of 248 nm. Subsequently, the exposed films were post-baked on a hotplate at 125° C. for 1 min. Development was effected by dipping the films into a 0.02 N TMAH solution for 1 min, followed by rinsing with deionized (DI) water. The resulting images were evaluated by SEM after a 20 nm gold thin film was sputtered over the resist films. The POSS-containing samples did not decrease the sensitivity of resists because of its inorganic component. Doses from 2 to 30 µC/cm$^2$ created equally good images. For example, micrographs showing isolated lines with a dimension of 228 nm imaged under 248 nm DUV were obtained for sample 2c at 20 keV.

EXAMPLE 5

Preparation of Additional Methacrylate-Based CA Resists Incorporating Other Polyhedral Oligosilsesquioxane (POSS) Monomers.

Other POSS components could be incorporated into the methacrylate-based CA resist according to the method of Example 1. For example, additional POSS components that could be used include, but are not limited to 3-[(3,5,7,9,11, 13,15-heptacyclopentylpentacyclo-[9.5.1.1$^{3,9}$.1$^{5,15}$.1$^{7,13}$]octasiloxan-1-yloxy)dimethylsilyl]propyl methacrylate (abbreviated dimethylsilyloxy(propyl)methacrylate-POSS) and 1,3,5,7,9,11,13-heptacyclopentyl-15vinylpentacyclo-[9.5.1.1$^{3,9}$.1$^{5,15}$.1$^{7,13}$]octasiloxane (abbreviated vinyl-POSS). In addition, structurally similar POSS compounds, in which the silicon atoms at the corners of the POSS cage are substituted with R groups other than cyclopentyl, could be used in the prepraration of methacrylate-based CA resists according to the present invention. Thus, in FIG. 1, POSS monomers could be used wherein R is selected from alkyl, cycloalkyl, aryl, alkenyl, alkynyl, aralkyl, aralkenyl, heteroalkyl, heterocycloalkyl, substituted derivatives thereof, combinations thereof, or similar substitutents.

EXAMPLE 6

Preparation of a Sulfonium Photoacid Generating (PAG) Monomer

All materials used for preparation of the photoacid generating (PAG) monomeric component were obtained from Aldrich and were used as received. HCl gas was generated in situ by the reaction of concentrated sulfuric acid (98%) and analytical-grade hydrochloric acid (36.5%). The HCl gas produced was dried by passing through concentrated $H_2SO_4$. A 23.5-g (0.25 mol) sample of phenol ($C_6H_5OH$) and a 19.5-g (0.25 mol) sample of dimethyl sulfoxide ($Me_2SO$) were dissolved in 200 ml of methanol in a three-necked flask, fitted with a thermometer. This solution was cooled to below 5° C. Under stirring, anhydrous HCl was slowly bubbled through the solution until white solid appeared, indicating that the solution was saturated with the p-dimethylsulfonium chloride product, [p-HOC$_6$H$_4$SMe$_2$]Cl. Throughout the reaction, the temperature was maintained below 5° C. to avoid undesirable side reactions.

When the reaction was complete, the dissolved HCl was removed from the solution under reduced pressure in a rotary evaporator. The resulting solution was then poured into 400 ml of diethyl ether. The sulfonium chloride product [p-HOC$_6$H$_4$SMe$_2$]Cl obtained was collected by filtration, washed thoroughly with diethyl ether, and dried overnight under vacuum. The overall yield of [p-HOC$_6$H$_4$SMe$_2$]Cl was 70%, the identity of which was confirmed by $^1$H NMR spectroscopy.

A 20 g sample of the sulfonium chloride [p-HOC$_6$H$_4$SMe$_2$]Cl and a slight excess of sodium triflate (NaOSO$_2$CF$_3$) were suspended in 100 ml of anhydrous acetone and stirred vigorously at room temperature for 12 hours. The unreacted solids were filtered off, and the solvent was removed from the filtrate under vacuum to provide the sulfonium triflate compound [p-HOC$_6$H$_4$SMe$_2$]OSO$_2$CF$_3$ in 91% yield.

A 20 g (0.066 mol) sample of [p-HOC$_6$H$_4$SMe$_2$]OSO$_2$CF$_3$ and 2.68 g (00.067 mol) of sodium hydroxide were dissolved in 50 ml of methanol and the resulting solution stirred at room temperature for 1 hour. The solvent was removed under reduced pressure to provide a solid, which was extracted with 50 ml of acetone. The undissolved residue (NaOH) was filtered off and the solvent removed from the filtrate under vacuum to provide [p-NaOC$_6$H$_4$SMe$_2$]SO$_2$CF$_3$ in 96% yield.

The sample of [p-NaOC$_6$H$_4$SMe$_2$]OSO$_2$CF$_3$ prepared in this fashion was dissolved in acetonitrile, and a 20% molar excess of methacryloyl chloride was slowly added to the solution under stirring at room temperature overnight. After this time, the precipitated NaCl was filtered off, and the filtrate was poured into 400 ml of diethyl ether to precipitate the PAG monomer product [p-CH$_2$~C(CH$_3$)C(O)OC$_6$H$_4$SMe$_2$]OSO$_2$CF$_3$, which was collected and washed thoroughly with diethyl ether. Recrystallization of this product in warm (ca. 50° C.) THF yielded pure PAG monomer [p-CH$_2$~C(CH$_3$)C(O)OC6H4SMe2]OSO$_2$CF$_3$ in 88% yield.

EXAMPLE 7

Co-Polymerization of a Sulfonium Photoacid Generating (PAG) Monomer with Methacrylate Monomers Both homo-(infra) and co-polymerization of the PAG monomer [p-CH$_2$~C(CH$_3$)C(O)OC$_6$H$_4$SMe$_2$]OSO$_2$CF$_3$ were initiated by AIBN (α,α'-azobis(isobutyronitrile)). All monomers except the PAG monomer, viz. methyl methacrylate (MMA), tert-butyl methacrylate (TBMA), itaconic anhydride (IA), and methacrylic acid (MAA) were obtained from Polysciences or Aldrich. The liquid monomers were vacuum distilled under nitrogen prior to use, and the propyl methacrylate POSS monomer (3-(3,5,7,9,11,13,15-heptacyclopentylpentacyclo-[9.5.1.1$^{3,9}$.1$^{5,15}$.1$^{7,13}$]octasiloxane-1-yl)propyl methacrylate) (Aldrich) was used as received. A typical procedure is as follows. A solution of the monomers (typically 5 g total) and 1 wt % AIBN relative to the monomers was prepared in THF and was filtered through a 0.5 μm Teflon micro filter into a sealed flask. Three freeze-pump-thaw cycles were carried out to remove oxygen from the sample. The resulting clear solution was then placed in a 60° C. oil bath under nitrogen with stirring. The reaction was stirred at this temperature for 1–2 days to achieve high conversion to the polymer. After this time, the reaction mixture was added dropwise into sufficient hexane to precipitate the polymer, which was isolated by filtration and and washed thoroughly with hexane. The PAG/methacrylate copolymers were purified by dissolving in acetone and re-precipitated with either methanol or water. Finally the purified sample was dried in vacuum at 60° C. for 1 to 2 days.

EXAMPLE 8

Characterization of a Sulfonium Photoacid Generating (PAG) Copolymer

The thermal stability of all samples was measured using a Perkin Elmer Thermogravimetric Analyzer 7 (TGA). TGA samples were heated at a rate of 20° C./min with a $O_2$ or $N_2$ gas flow of 25 cm$^3$/min. Molecular weights were measured by a Millipore Waters GPC using THF as the eluent for the copolymers and monodispersed polystyrene samples as calibration standards. Compositions in copolymers were determined by inverse-gated $^{13}$C NMR spectroscopy, combined with TGA-in-O$_2$ for determination of POSS content and elemental analysis for PAG content (by measuring sulfur content).

Table 3 presents the relative weight percents of monomers loaded into the mixture to be polymerized, and the percent composition of that monomer in the resulting polymer. Table 4 also presents the weight-average molecular weights ($M_W$) and polydispersity indices (PDI) of each polymer sample.

TABLE 4

Polymer composition and physical properties of the PAG/Methacrylate Co-polymers.

| Sample No. | Compositions Loading (in polymer), wt % | | | | | | $M_w$ (g/mol) × $10^5$ | PDI |
|---|---|---|---|---|---|---|---|---|
| | POSS | MMA | TBMA | IA | MAA | PAG | | |
| 8a | 15 (19.7) | 0 (0) | 70 (67.1) | 0 (0) | 0 (0) | 15 (13.2) | 1.83 | 1.58 |
| 8b | 15 (17.3) | 15 (25.7) | 40 (31.9) | 15 (13.8) | 0 (0) | 15 (11.3) | 1.70 | 1.69 |
| 8c | 10 (8.8) | 30 (27.7) | 40 (44.9) | 0 (0) | 10 (12.4) | 15 (10.4) | 1.71 | 1.63 |

EXAMPLE 9

Use of a Sulfonium Photoacid Generating (PAG) Co-Polymers as a Negative Resist and Acid Generating Efficiency Measurements Resist films were spin cast onto 3-inch Si wafers whose weights were predetermined on a analytical balance, from 10% wt resist solutions in acetone. The resist films were then baked at 130° C. for 5 min to remove the solvent, weighed again, and the amount of resist film on the Si wafer was determined by calculating the weight difference. The resist films were then exposed to 254 nm DUV radiation (254 nm UV lamp, model R52G, UVP, Inc., Upland, Calif.) equipped with a radiometer. Doses were calculated by exposure times multiplied by lamp intensity. Each film to be analyzed was stripped from the Si wafer with acetonitrile and added to 2 ml of a stock solution of 0.1 mM tetrabromophenol blue (TBPB) in acetonitrile. The total volume was then raised to 10 ml by the addition of acetonitrile. The resulting solution was characterized by UV spectroscopy. The amount of acid generated in each film by UV radiation was determined by monitoring the absorbance change of the TBPB indicator at 620 nm, against calibration curves predetermined by using known amounts of triflic acid. Calibration curves showed a linear relationship between the amount acid added to the indicator solution and the resulting absorbance intensity change at 620 nm. For comparison, the acid generating efficiency for each resist is expressed as mole of acid/mole of PAG units in the resist. The number of moles of PAG units in each resist was determined by elemental analysis and resist weight.

EXAMPLE 10

Imaging Experiments for Chemically Amplified (CA) Resists Containing a Photoacid Generating (PAG) Group in the Resist Polymer Chain for PAG Co-Polymers For chemically amplified (CA) resists containing photoacid generating groups (PAG) in the chain, thin films were spin-coated onto 5-inch silicon wafers from 5 wt % polymer solutions in propylene glycol methyl ether (PGME). All resist films were prebaked at 125° C. for 2 min before exposure. The exposure experiments were performed on a Nikon EX7 DUV 248 nm Excimer Laser Stepper, after which the exposed films were post baked on a hotplate at 125° C. for 1 min. For these CA resists, development was achieved by dipping the films in 0.26 N tetramethylammonium hydroxide (TMAH) for 1 min, followed by rinsing with deionized water. The resulting images were evaluated by SEM after a 20 nm gold thin film was sputtered over the resist films.

The resists were also found to be very sensitive to electron beam radiation. The imaging experiments were carried out on a Leo 982 SEM with a Nabity pattern generator at 20 keV. The processing conditions were almost identical to the photo-exposure at 248 nm. All samples exhibited very high sensitivity under both 248 nm deep-UV and 20 keV electron exposures.

EXAMPLE 11

Preparation of Tetrahydropyranyl Ether Benzyldehyde (THPB)

This Example describes the preparation of the compound THPB shown in the following reaction scheme.

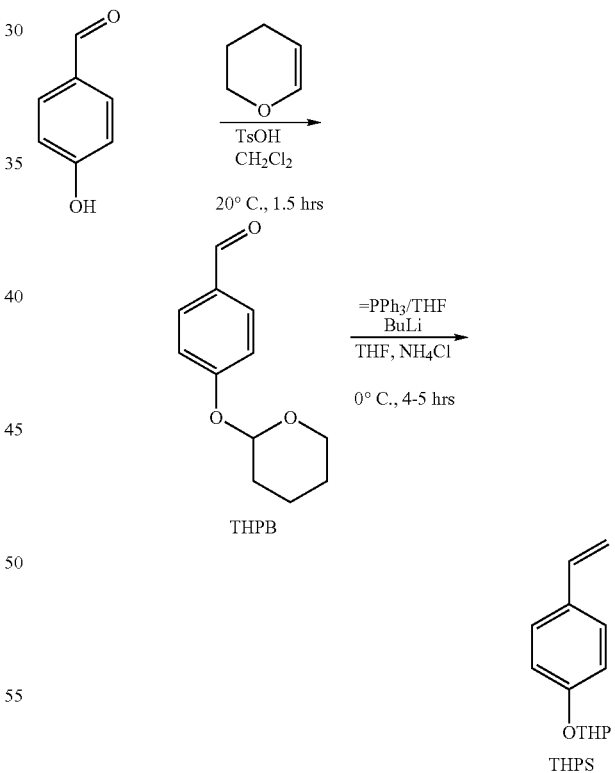

All chemicals were purchased from Fisher Scientific (ACROS Chemical), including 3,4-dihydro-2H-pyran, 4-hydroxy aldehyde, methyltriphenyl-phosphonium bromide, butyl lithium (BuLi). The acid catalyst p-toluenesulphonic acid (TsOH) was supplied by Aldrich Chemical Company. Dichloromethane ($CH_2Cl_2$) was distilled over calcium hydride and tetrahydrofuran (THF) was distilled from sodium/benzophenone (2:1) prior to use. To a stirred, room temperature solution of 4-hydroxyphenyl aldehyde (12.2 gm; 10.0 mmol) and 3,4-dihydro-2H-pyran (16.8 gm; 20.0 mmol) in CH$_2$Cl$_2$ was added an acid catalyst [10 mol % of p-toluene sulfonic acid (TsOH), 0.144 g (0.76 mmol)], under a nitrogen atmosphere. The resulting mixture was stirred for 1.5 hr at room temperature. The resulting reaction mixture was then diluted with 200 mL of diethyl ether to provide a solution that was washed with a mixture prepared from 120 mL of aqueous saturated Na$_2$CO$_3$, 120 mL of saturated brine (aqueous NaCl), and 240 mL of water. The aqueous phase was extracted with diethyl ether to yield a faint yellow ether solution of the desired compound. The ether extract was dried over MgSO$_4$, followed by removal of the ether solvent in vacuo, to provide the tetrahydropyranyl ether benzyldehyde compound THPB as a faint yellow oil in about 70% yield.

EXAMPLE 12

Preparation of Tetrahydropyranyl Oxystyrene (THPS) Monomer

Under a nitrogen atmosphere, a solution of BuLi (2.5M solutions in hexane, 11.2 mL, 28 mmol) was slowly added (dropwise) to a stirred, cold (0° C., maintained at all times) suspension of methyltriphenyl phosphonium bromide (10.18 g, 28.5 mmol) in 50 mL of THF, over which time a yellow color developed in the solution. After the BuLi addition was completed, and the resulting mixture was stirred for about 10 min, a solution of tetrahydropyranyl ether benzyldehyde (THPB) (6.15 g, 30 mmol) in 50 mL of THF was added dropwise via needle, over a period of about 40–60 min. The resulting yellow suspension was stirred for about 4 h and then treated by NH$_4$Cl addition (about 1.0 g). This mixture was filtered and the filtrate concentrated under vacuum. The resulting viscous liquid was purified by column chromatography using silica as the support and ethyl acetate as the solvent. The volatile components were removed under vacuum to provide and the product tetrahydropyranyl oxystyrene (THPS) monomer as a white solid in 52% yield. Samples of THPS obtained in this manner were used immediately in the polymerization reaction. (In the Scheme above, THP is tetrahydropyranyl.)

EXAMPLE 13

Deprotection of Tetrahydropyranyl Oxystyrene (THPS) monomer to Prepare p-Hydroxystyrene Monomer (PHS)

This example describes the preparation of the compound p-hydroxystyrene monomer (PHS) shown in the following reaction scheme.

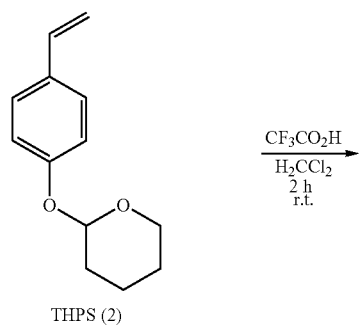

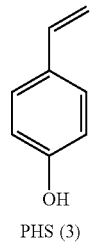

The tetrahydropyranyl oxystyrene (THPS) monomer was deprotect by treating with trifloroacetic acid (CF$_3$CO$_2$H) in dicloromethane solution at room temperature for 2 h, to generate the p-hydroxystyrene (PHS) monomer.

EXAMPLE 14

Preparation of Poly (Tetra-Hydropyranyl Oxystyrene) (p-THPS) Containing a Photoacid Generating (PAG) Component with a Polyhedral Oligosilsesquioxane (POSS) Component The polymerization of tetra-hydropyranyl oxystyrene (THPS) was carried out in 50 ml of a THF/acetonitrile solvent system (1:0.25 vol/vol) incorporating 3-(3,5,7,9,11,13,15-heptacyclopentylpenta-cyclooctasiloxyanyl) propyl methacrylate (POSS™) monomer, the photoacid generating (PAG) component [p-CH$_2$~C(CH$_3$)C(O)OC$_6$H$_4$SMe$_2$] OSO$_2$CF$_3$, and the free radical initiator (AIBN). The relative proportions of components for this reaction, along with related polymerizations (including polymerizations without a POSS component) are provided in Table 5. This mixture was polymerized (solution polymerization process) in a quartz polymerization reactor at 60° C. for 24 h. After polymerization was complete, the reaction solution was added dropwise into a large volume (800 ml) of n-hexane in a 1 liter beaker which was being vigorously stirred. The polymeric product formed a white precipitate upon addition to n-hexane, which was filtered off and dried under vacuum for 2 h at 50° C. The resulting white solid was then dissolved in a small amount of THF and re-precipitated with n-hexane. This re-precipitated product was filtered off and dried under vacuum at 50° C. for 24 h. The final poly (tetra-hydropyranyl oxystyrene) (p-THPS) product was obtained as a white powder in 67% yield.

TABLE 5

Polymer loading for photoresist formulations using newly developed monomers under free radical polymerization conditions. Amounts of monomers are provided as a weight percent, and in each case, 1% AINB (by weight) was used as free radical polymerization initiator.

| Formulation Number | Monomer | | | | | | |
|---|---|---|---|---|---|---|---|
| | THPS | PHS | MMA | MAA | t-BMA | POSS ™ | PAG |
| 1 | 80 | — | — | — | — | 10 | 10 |
| 2 | 90 | — | — | — | — | — | 10 |
| 3 | 80 | 10 | — | — | — | — | 10 |
| 4 | 40 | 05 | — | — | 40 | 05 | 10 |

EXAMPLE 15

Preparation of a Poly (p-hydroxy styrene) (p-PHS) Containing a Photoacid Generating (PAG) Component with a Polyhedral Oligosilsesquioxane (POSS) Component The polymerization of p-hydroxy styrene (PHS) was carried out in 50 mL of a THF/acetonitrile solvent system (1:0.25 vol/vol) incorporating 3-(3,5,7,9,11,13,15-heptacyclopentylpenta-cyclooctasiloxyanyl) propyl methacrylate (POSS™) monomer, the photoacid generating (PAG) component [p-$CH_2$~C($CH_3$)C(O)O$C_6H_4$S$Me_2$]O$SO_2CF_3$, and the free radical initiator (AIBN). The relative proportions of components in this and related polymerizations are provided in Table 5.

This reaction mixture was polymerized as a solution polymerization in a quartz polymerization reactor at 60° C. for 24 h. After polymerization was complete, the reaction solution was added dropwise into 800 mL of n-hexane in a 1 liter beaker which was being vigorously stirred. The polymeric product formed a white precipitate upon addition to n-hexane, which was filtered off and dried under vacuum for 2 h at 50° C. The resulting white solid was then dissolved in a small amount of THF and re-precipitated with n-hexane. This re-precipitated product was filtered off and dried under vacuum at 50° C. for 24 h. The final poly (p-hydroxy styrene) p-PHS-POSS-PAG product was obtained as a white powder in 82% yield.

EXAMPLE 16

Preparation of a POSS-PAG Copolymer Crosslinked with PHS

This negative resist design is based on the cross-linking reaction of two polymeric components: an epoxy-containing POSS monomer co-polymerized with a monomeric PAG to form a first polymer, and a low molecular weight poly (hydroxystyrene) (poly-PHS) second polymer. These two components, shown in FIG. 3, undergo a rapid alcoholysis cross-linking reaction upon reaction in the presence of AIBN.

The POSS-PAG copolymer was prepared by admixing a selected POSS and the photoacid generating (PAG) component [p-$CH_2$~C($CH_3$)C(O)—O$C_6H_4$S$Me_2$]O$SO_2CF_3$ in about 50 ml of a THF/acetonitrile solvent system (1:1 vol/vol) and reacting the mixture in the presence of about 1% (wt/wt) of the free radical initiator (AIBN). This mixture was polymerized as a solution polymerization in a quartz polymerization reactor at 60° C. for 24 h. After irradiation was complete, the reaction solution was added slowly into a large volume of n-hexane in a 1 liter beaker which was being vigorously stirred. A range of POSS/PAG ratios are possible, but typically the POSS/PAG weight ratios range from about 0.5:1 to about 5:1. Typically the POSS/PAG ratios range from about 0.7:1 to about 3:1. Any POSS containing at least one epoxide group and at least one other polymerizable group can be used in this preparation, which includes any POSS with two or more expoxide groups.

The resulting POSS-PAG co-polymeric product formed a white precipitate upon addition to n-hexane, which was filtered off and dried under vacuum for 2 h at 50° C. The resulting white solid was then re-dissolved in THF/acetonitrile solvent system (1:1 vol/vol), to which was added about a 2- to 8-fold excess (wt/wt) of the poly- or oligo-PHS, prepared under similar conditions. Typically, the poly-PHS to POSS-PAG ratio ranges from about 6:1 to about 2:1 (wt/wt). In a typical formulation, the final copolymer ratios (by weight) were about 10–15% POSS, about 5–15% PAG and about 70–85% PHS.

EXAMPLE 17

Preparation of a PHS-PAG Copolymer Crosslinked with a POSS™ Epoxide

The p-hydroxystyrene (PHS) and PAG can be converted into an oligomer and then crosslinked with the epoxy POSS monomer to form another embodiment. The POSS monomer contains at least two epoxy functional groups in order for it to behave as a cross-linker. In a variation of this approach, vinyl or allyl functionalized POSS™ can be crosslinked with H-silsesquioxane (HSQ) using various photoinitiators for fast cure.

Co-polymerization of PHS (or its derivatives or analogs) and the photoacid generating (PAG) component [p-$CH_2$~C($CH_3$)C(O)—O$C_6H_4$S$Me_2$]O$SO_2CF_3$ was carried out in about 50 ml of a THF/acetonitrile solvent system (1:1 vol/vol) and the mixture was reacted in the presence of about 1% (wt/wt) of the free radical initiator (AIBN). This mixture was reacted under the conditions described above in Example 16, and the PHS-PAG copolymer (or cooligomer) was isolated as described for the coplymer of Example 16, or it could be reacted with the epoxy POSS cross-linker without being isolated. A range of PHS/PAG ratios are possible, but typically the PHS/PAG weight ratios range from about 8:1 to about 2:1, typically from about 5:1 to about 3:1.

The resulting PHS-PAG copolymer was then reacted with any POSS monomer that contained at least two epoxide groups, to effect the cross-linking reaction. The final PHS-PAG-POSS resist polymer was isolated as described above in Example 16. In a typical formulation, the final copolymer ratios (by weight) were about 80–90% PHS-PAG copolymer about 10–15% POSS (wt/wt).

EXAMPLE 18

Preparation of Negative Resists Using the Cross-Linked Negative Resists

Resist films prepared using the polymeric materials from Examples 16 and 17 can be spin cast onto 3-inch Si wafers whose weights were predetermined on a analytical balance, from 10% wt resist solutions in acetone. The resist films are then baked at about 130° C. for abut 5 min to remove the solvent, weighed again, and the amount of resist film on the Si wafer is determined by calculating the weight difference. The resist films are then exposed to 254 nm DUV radiation. Doses can be calculated by exposure times multiplied by lamp intensity. Each film to be analyzed is stripped from the Si wafer with acetonitrile and added to 2 ml of a stock solution of 0.1 mM tetrabromophenol blue (TBPB) in acetonitrile. The total volume is then raised to 10 ml by the addition of acetonitrile. The resulting solution is characterized by UV spectroscopy. The amount of acid generated in each film by UV radiation is determined by monitoring the absorbance change of the TBPB indicator at 620 nm, against calibration curves predetermined by using known amounts of triflic acid.

EXAMPLE 19

Lithographic Properties of the Nanocomposite Resists Under 13.4 nm EUV, 1 nm XRL, and Related Protocols The lithographic properties of the nanocomposite resists of this invention were evaluated under a number of standard lithographic protocols, including 13.4 nm EUV and 1 nm X-ray protocols. For example, using both EUV and X-ray lithographic protocols for samples 2a through 2d (see Example 2), high sensitivity was observed for both EUVL exposure (1.0–1.2 mJ/cm$^2$) and XRL exposure (70–100 mJ/cm$^2$) and high contrast ($\gamma$=5.2 for EUVL and $\gamma$=5.1 for XRL) was also established. These resists also constitute potential candidates for low voltage EB lithography (sensitivity=0.6 µC/cm$^2$; contrast=4.5).

What is claimed is:

1. A nanocomposite resist polymer comprising:
   a photoacid generating component; and
   a styrene component, wherein the photoacid generating component and styrene component are copolymerized and wherein the photoacid generating component comprises [p-CH$_2$~C(CH$_3$)C(O)OC$_6$H$_4$SMe$_2$]OSO$_2$CF$_3$.

2. The nanocomposite resist polymer of claim 1, wherein the styrene component comprises tetrahydropyranyl oxystyrene (THPS), para-hydroxy styrene (PHS), poly-(tetrahydropyranyl oxystyrene) (poly-THPS), poly-(para-hydroxy styrene (poly-PHS), or combinations thereof.

3. The nanocomposite resist polymer of claim 1 further comprising a polyhedral oligosilsequioxane component.

4. The nanocomposite resist polymer of claim 3, wherein the polyhedral oligosilsequioxane component comprises 3-(3,5,7,9,11,13,15-heptacyclo-pentylpentacyclo-[9.5.1.1$^{3,9}$.1$^{5,15}$.1$^{7,13}$]octasiloxane-1-yl)propyl methacrylate; 3-[(3,5,7,9,11,13,15-heptacyclopentylpentacyclo-[9.5.1.1$^{3,9}$.1$^{5,15}$.1$^{7,13}$]octasiloxan-1-yloxy)dimethylsilyl]propyl methacrylate; 1,3,5,7,9,11,13-heptacyclopentyl-15vinylpentacyclo-[9.5.1.1$^{3,9}$.1$^{5,15}$.1$^{7,13}$]octasiloxane, or combinations thereof.

5. The nanocomposite resist polymer of claim 3, wherein the polyhedral oligosilsequioxane component comprises Allylcyclohexyl-POSS, Allylcyclopentyl-POSS, Allylisobutyl-POSS, Tris(dimethylvinyl)cyclohexyl-POSS, Tris(dimethylvinyl)cyclo-pentyl-POSS, Tris(dimethylvinyl)isobutyl-POSS, Acrylocyclohexyl-POSS, Acrylocyclopentyl-POSS, Acryloisobutyl-POSS, Methacrylcyclohexyl POSS, Methacrylcyclopentyl POSS, Methacrylisobutyl POSS, Methacrylisooctyl POSS, Norbornenylethylcyclohexyl-POSS, Norbornenylethylcyclopentyl-POSS, Norbornenylethylisobutyl-POSS, EpoxycyclohexylCyclohexyl-POSS, EpoxycyclohexylCyclopentyl-POSS, Epoxycyclohexylisobutyl-POSS, Epoxycyclohexyldisilanolisobutyl-POSS, 8-substituted Epoxycyclohexyl-POSS Cage, 10-substituted Epoxycyclohexyl-POSS Cage, 12-substituted Epoxycyclohexyl-POSS Cage, Epoxypropylcyclopentyl-POSS, Epoxypropylisobutyl-POSS, Glycidylcyclopentyl-POSS, Glycidylethyl-POSS, Glycidylisobutyl-POSS, Glycidylisooctyl-POSS, or combinations thereof.

6. The nanocomposite resist polymer of claim 3, wherein the polymer is prepared from about 5% to about 20% by weight of the photoacid generating component, about 70% to about 90% by weight of the styrene component, and about 3% to about 20% by weight of the polyhedral oligosilsequioxane component.

7. The nanocomposite resist polymer of claim 3, wherein the polymer is prepared from about 5% to about 15% by weight of the photoacid generating component, about 70% to about 85% by weight of the styrene component, and about 10% to about 15% by weight of the polyhedral oligosilsequioxane component.

8. The nanocomposite resist polymer of claim 1, further comprising a methacrylate component.

9. The nanocomposite resist polymer of claim 8, wherein the methacrylate component comprises methyl methacrylate, t-butyl methacrylate, methacrylic acid, or a combination thereof.

10. The nanocomposite resist polymer of claim 8, further comprising a dissolution promoter.

11. The nanocomposite resist polymer of claim 10, wherein the dissolution promoter comprises itaconic anhydride.

12. The nanocomposite resist polymer of claim 1, wherein the polymer is prepared from about 10% to about 20% by weight of the photoacid generating component, about 80% to about 90% by weight of the styrene component.

13. A lithographic process comprising the steps of exposing a lithographic recording medium to a radiation source and developing the exposed recording medium wherein the lithographic recording medium comprises the nanocomposite resist polymer of claim 1.

14. The lithographic process of claim 13 wherein the process is an extreme ultraviolet lithographic process.

15. The lithographic process of claim 13 wherein the process is an X-ray lithographic process.

16. The lithographic process of claim 13 wherein the process is a vacuum ultraviolet lithographic process.

17. The lithographic process of claim 13 wherein the process is an electron beam lithographic process.

18. The lithographic process of claim 13 wherein the process is an ion beam lithographic process.

19. A nanocomposite resist polymer comprising tetrahydropyranyl oxystyrene or poly(hydroxystyrene), 3-(3,5,7,9,11,13,15-heptacyclopentylpentacyclo-[9.5.1.1$^{3,9}$.1$^{5,15}$.1$^{7,13}$]octasiloxane-1-yl)propyl methacrylate, and [p-CH$_2$~C(CH$_3$)C(O)—OC$_6$H$_4$SMe$_2$]OSO$_2$CF$_3$.

20. The nanocomposite resist polymer of claim 19, further comprising t-butyl methacrylate.

21. A nanocomposite resist polymer comprising:
    a photoacid generating component; and
    a styrene component, wherein the photoacid generating component comprises [p-CH$_2$~C(CH$_3$)C(O)OC$_6$H$_4$SMe$_2$]OSO$_2$CF$_3$.

22. A nanocomposite resist polymer comprising:
    a photoacid generating component;
    a styrene component; and
    a polyhedral oligosilsequioxane component.

23. The nanocomposite resist polymer of claim 22, wherein the polyhedral oligosilsequioxane component comprises 3-(3,5,7,9,11,13,15-heptacyclo-pentylpentacyclo-[9.5.1.1$^{3,9}$.1$^{5,15}$.1$^{7,13}$]octasiloxane-1-yl)propyl methacrylate; 3-[(3,5,7,9,11,13,15-heptacyclopentylpentacyclo-[9.5.1.1$^{3,9}$.1$^{5,15}$.1$^{7,13}$]octasiloxan-1-yloxy)dimethylsilyl]propyl methacrylate; 1,3,5,7,9,11,13-heptacyclopentyl-15vinylpentacyclo-[9.5.1.1$^{3,9}$.1$^{5,15}$.1$^{7,13}$]octasiloxane, or combinations thereof.

24. The nanocomposit resist polymer of claim 22, wherein the polyhedral oligosilsequioxane component comprises Allylcyclohexyl-POSS, Allylcyclopentyl-POSS, Allylisobutyl-POSS, Tris(dimethylvinyl)cyclohexyl-POSS, Tris(dimethylvinyl)cyclo-pentyl-POSS, Tris(dimethylvinyl)isobutyl-POSS, Acrylocyclohexyl-POSS, Acrylocyclopentyl-POSS, Acryloisobutyl-POSS, Methacrylcyclohexyl POSS, Methacrylcyclopentyl POSS, Methacrylisobutyl POSS, Methacrylisooctyl POSS, Norbornenylethylcyclohexyl-POSS, Norbornenylethylcyclopentyl-POSS, Norbornenylethylisobutyl-POSS, EpoxycyclohexylCyclohexyl-POSS, EpoxycyclohexylCyclopentyl-POSS, Epoxycyclohexylisobutyl-POSS, Epoxycyclohexyldisilanolisobutyl-POSS, 8-substituted Epoxycyclohexyl-POSS Cage, 10-substituted Epoxycyclohexyl-POSS Cage, 12-substituted Epoxycyclohexyl-POSS Cage, Epoxypropylcyclopentyl-POSS, Epoxypropylisobutyl-POSS, Glycidylcyclopentyl-POSS, Glycidylethyl-POSS, Glycidylisobutyl-POSS, Glycidylisooctyl-POSS, or combinations thereof.

25. The nanocomposite resist polymer of claim 22, wherein the polymer is prepared from about 5% to about 20% by weight of the photoacid generating component, about 70% to about 90% by weight of the styrene component, and about 3% to about 20% by weight of the polyhedral oligosilsequioxane component.

26. The nancomposite resist polymer of claim 22, wherein the polymer is prepared from about 5% to about 15% by weight of the photoacid generating component, about 70% to about 85% by weight of the styrene component, and about 10% to about 15% by weight of the polyhedral oligosilsequioxane component.

27. The nanocomposite resist polymer of claim 22, further comprising a methacrylate component.

28. The nanocomposite resist of claim 27, wherein the methacrylate component comprises methyl methacrylate, t-butyl methacrylate, methacrylic acid, or a combination thereof.

29. The nanocomposite resist polymer of claim 27, further comprising a dissolution promoter.

30. The nanocomposite resist polymer of claim 29, wherein the dissolution promoter comprises itaconic anhydride.

31. The nanocomposite resist of claim 22 wherein the photoacid generating component comprises $[p\text{-}CH_2\text{~}C(CH_3)C(O)OC_6H_4SMe_2]OSO_2CF_3$.

32. A nanocomposite resist polymer comprising:
   a photoacid generating component;
   a styrene component; and
   a methacrylate component, wherein the methacrylate component comprises methyl methacrylate, t-butyl methacrylate, methacrylic acid, or combinations thereof and wherein the photoacid generating component comprises $[p\text{-}CH_2\text{~}C(CH_3)C(O)OC_6H_4SMe_2]OSO_2CF_3$.

* * * * *